United States Patent
Okuyama et al.

(10) Patent No.: US 8,668,843 B2
(45) Date of Patent: Mar. 11, 2014

(54) M-C-N-O BASED PHOSPHOR

(75) Inventors: Kikuo Okuyama, Higashihiroshima (JP); Akihiro Yabuki, Higashihiroshima (JP); Ferry Iskandar, Higashihiroshima (JP); Takashi Ogi, Sakai (JP); Jun Takai, Kurashiki (JP); Hideharu Iwasaki, Kurashiki (JP)

(73) Assignees: Hiroshima University, Hiroshima-shi (JP); Kuraray Co., Ltd., Kurashiki-shi (JP)

( * ) Notice: Subject to any disclaimer, the term of this patent is extended or adjusted under 35 U.S.C. 154(b) by 864 days.

(21) Appl. No.: 12/593,307

(22) PCT Filed: Feb. 29, 2008

(86) PCT No.: PCT/JP2008/053669
§ 371 (c)(1),
(2), (4) Date: Dec. 31, 2009

(87) PCT Pub. No.: WO2008/126500
PCT Pub. Date: Oct. 23, 2008

(65) Prior Publication Data
US 2010/0109508 A1 May 6, 2010

(30) Foreign Application Priority Data
Mar. 28, 2007 (JP) .................. 2007-085442

(51) Int. Cl.
C09K 11/08 (2006.01)

(52) U.S. Cl.
USPC ................................ 252/301.4 R

(58) Field of Classification Search
USPC ................................ 252/301.4 R
See application file for complete search history.

(56) References Cited

U.S. PATENT DOCUMENTS 3,021,285 A * 2/1962 Bovarnick et al. ..... 252/301.4 R

FOREIGN PATENT DOCUMENTS

| JP | 2003-249373 | 9/2003 |
|---|---|---|
| JP | 2004-27036 | 1/2004 |
| JP | 2005-97022 | 4/2005 |
| JP | 2005-225942 | 8/2005 |
| JP | 2005-339924 | 12/2005 |
| JP | 2006-28295 | 2/2006 |
| JP | 2006-348070 | 12/2006 |
| JP | 2008-13674 | 1/2008 |
| WO | WO 2008088774 A2 * | 7/2008 |

OTHER PUBLICATIONS

Liu et al. 'Green emission from B2N2CO thin films doped with Tb', Jul. 1, 2002, Applied Physics Letters, vol. 81, No. 1, pp. 34-36.*
Okamoto et al., 'The ohmic character of doped AlN films', 2001, Diamond and Related Materials, vol. 10, pp. 1322-1325.*
Kucheyev et al., 'Chemical origin of the yellow luminescence in GaN', 2002, Journal of Applied Physics, vol. 91, No. 9, pp. 5867-5874.*
Ogi et al., 'Facile Synthesis of new Full-Color-Emitting BCNO Phosphors with High Quantum Efficiency', Jul. 14, 2008, Advanced Materials, vol. 20, pp. 3235-3238.*
D. Wauters, et al., "Optical Characterisation of SrS: Cu and SrS: Cu,Ag EL Devices" Journal of Luminescence, vol. 91, Issues 1-2, Sep. 2000, pp. 1-6.
Guo Runhong, et al., "Optical Properties of Blue-Emitting $BaAl_2S_4$: Eu Thin-Films for Inorganic EL Display", Journal of Rare Earths, vol. 24, Special Issue, Dec. 2006, pp. 119-121.
U.S. Appl. No. 13/133,795, filed Jun. 9, 2011, Takai, et al.
Extended European Search Report issued Dec. 2, 2011 in Application No. 08721089.4.
Masayuki Kawaguchi, "B/C/N Materials Based on the Graphite Network", Advanced Materials, vol. 9, No. 8, XP000656803, Jun. 1, 1997, pp. 615-625.
S. O. Kucheyev, et al. "Chemical origin of the yellow luminescence in GaN", Journal of Applied Physics, vol. 91, No. 9, XP012056352, May 1, 2002, pp. 5867-5874.
Q. L. Liu, et al., "Green emission from $B_2N_2CO$ thin films doped with Tb", Applied Physics Letters, vol. 81, No. 1, XP012031783, Jul. 1, 2002, pp. 34-36.

* cited by examiner

Primary Examiner — Emily Le
Assistant Examiner — Lynne Edmondson
(74) Attorney, Agent, or Firm — Oblon, Spivak, McClelland, Maier & Neustadt, L.L.P.

(57) ABSTRACT

An M-C—N—O based phosphor including a group IIIB element (M), carbon (C), nitrogen (O), wherein an amount of the group IIIB element (M) contained is 1%<(M)<50% by mass, an amount of carbon (C) contained is 0.005%<(C)<10% by mass, an amount of nitrogen (N) contained is 1%<(N)<60% by mass, an amount of oxygen (O) contained is 1%<(O)<75% by mass, and (M)+(C)+(N)+(O)=100% by mass. Colors of the M-C—N—O based phosphor can be changed by adjusting a peak top of an emission spectrum. Highly environmentally-compatible polymer dispersions, inorganic EL devices, light emitting devices, fluorescent tubes, and the like are also provided, which use the M-C—N—O based phosphors.

6 Claims, 14 Drawing Sheets

M-C-N-O BASED PHOSPHOR

TECHNICAL FIELD

The present invention relates to an M-C—N—O based phosphor comprising a group 13 element (M), carbon (C), nitrogen (N), and oxygen (O). The present invention also relates to a polymer dispersion, light emitting film, or phosphor layer comprising such an M-C—N—O based phosphor. The present invention further relates to an inorganic electroluminescent device, light emitting device, or fluorescent tube comprising such a phosphor layer.

BACKGROUND ART

Phosphors are used in fluorescent tubes, fluorescent display tubes, luminous display boards, and the like, and use of phosphors is increasing. Attempts have been made to use phosphors in combination with LEDs in various display apparatuses including TV monitors. White phosphors, which are expected to be applicable to a wide variety of fields, have also been actively studied and developed.

There are various organic and inorganic fluorescent materials, including natural fluorescent materials. In an attempt to improve required colors of light to be emitted, intensities of peaks of emission spectra, economical efficiencies, and the like, various materials have been researched and developed. In the researches and developments, there are disclosed some, but not many, boron nitride (BN) based fluorescent materials. For example, there is disclosed a method for the synthesis of a group 13 nitride, which comprises dissolving a group 13 element-containing compound and a nitrogen-containing compound in a solvent, evaporating the solvent to form a uniform mixture, and heating the uniform mixture to about 800° C. to nitride the group 13 element with nitrogen of the nitrogen-containing compound to obtain a group 13 nitride (Patent Citation 1). According to the disclosure, when fine BN particles synthesized by the above method were irradiated with ultraviolet light having a wavelength of 365 nm, a peak of an emission spectrum was observed at a wavelength of 395 nm; fine BN particles that were observed to emit light had a low degree of crystallinity (degree of hexagonal crystallinity) and contained a large amount of oxygen (11.7% by weight), whereas fine BN particles that were not observed to emit light had a high degree of crystallinity and contained a small amount of oxygen (4.1% by weight).
[Patent Citation 1] JP 2005-97022A There is proposed a $Eu^{2+}$-doped B—N—O based amorphous oxynitride phosphor having a high emission intensity at a wavelength of about 380 nm, which can efficiently excite an anatase $TiO_2$ photocatalyst. It is disclosed that the B—N—O based amorphous oxynitride phosphors doped with $Eu^{2+}$ in an amount of 1 atm % or greater had an increased emission intensity at the wavelength of 372 nm; the B—N—O based amorphous oxynitride phosphors doped with $Eu^{2+}$ in an amount of 2.5 atm % or greater had a significantly increased emission intensity at the wavelength of 372 nm; and the B—N—O based amorphous oxynitride phosphor doped with $Eu^{2+}$ in an amount of 5 atm % had a maximum emission intensity (Patent Citation 2).
[Patent Citation 2] JP 2005-225942A In addition to the boron nitride based fluorescent material described above, there is disclosed a SiAlON phosphor that is obtained by firing aluminum nitride, silicon nitride, silicon oxide and rare-earth oxide, and emits visible light of various colors (Patent Citation 3).
[Patent Citation 3] JP 2008-13674A There is also disclosed an M-Al—Si—N:Z based phosphor obtained by firing calcium nitride, aluminum nitride, silicon nitride, silicon oxide, and rare-earth oxide (Patent Citation 4).
[Patent Citation 4] JP 2006-28295A A range of applications of such phosphors has been increasing; for example, phosphors have been applied to electroluminescent devices. There is disclosed an inorganic electroluminescent device provided with a phosphor layer having phosphor particles comprising copper-doped zinc sulfide (Patent Citation 5), an inorganic electroluminescent device comprising not only zinc sulfide but also strontium sulfide (Non Patent Citation 1), and an inorganic electroluminescent device comprising cadmium selenide and zinc oxide (Patent Citation 6). There is also disclosed an inorganic electroluminescent device comprising a compound such as barium thioaluminate (Non Patent Citation 2).
[Patent Citation 5] JP 2005-339924A
[Patent Citation 6] JP 2003-249373A
[Non Patent Citation 1] Journal of Luminescence, Volume 91, Issues 1-2, September 2000, Pages 1-6
[Non Patent Citation 2] Journal of Rare Earths, Volume 24, Issues 1, Supplement 1, December 2006, Pages 119-121

DISCLOSURE OF INVENTION

Technical Problem

Since the production of many of conventional phosphors requires a temperature of 1000° C. or higher, BN based phosphors that can be produced at a low temperature of about 800° C., as in the method of Patent Citation 1 for the synthesis of the group 13 nitride, are noteworthy. Although Patent Citation 1 discloses that there is a relation between emission of light from the BN particles and the crystallinity of the particles and the amount of oxygen contained in the particles, details of the structure and luminous efficiency are not clear. Furthermore, there are operational problems that a step of reduction with hydrogen introduces complicated operations, and that a risk of explosions is high. There is also a practicality problem of lack of selectivity in wavelengths of light to be emitted. As in Patent Citation 1, the B—N—O based oxynitride phosphor disclosed in Patent Citation 2 also includes a step of reduction with hydrogen, and therefore has the same problems of complicated operations and a high risk of explosions. Furthermore, since doping of $Eu^{2+}$ is required, there are problems that use of such an activator agent makes the operation complicated and that use of an expensive activator agent is required.

There are disclosed some techniques relating to BN or B—N—O based phosphors, as disclosed in Patent Citation 1 or 2. Patent Citations 3 and 4 disclose techniques relating to phosphors comprising Al and a carbon congener, including carbon, noting that rare-earth elements essentially act as light-emitting substances. However, there has not been disclosed any M-C—N—O based phosphor that emits light in itself. Furthermore, there has not been disclosed any M-C—N—O based phosphor with an emission spectrum having a peak top and color that are variable depending on an amount of carbon contained in the phosphor. Such M-C—N—O based phosphors do not comprise heavy metals and thus have high environmental compatibility. Further, such M-C—N—O based phosphors do not comprise rare metals and thus have economical advantages and are free of external factors such as availability of rare metals. Furthermore, development of such M-C—N—O based phosphors into white phosphors is also expected. Accordingly, there are social demands for such M-C—N—O based phosphors.

Such M-C—N—O based phosphors should be applied to a wide variety of practical uses. For example, an inorganic electroluminescent device having an M-C—N—O based phosphor as a phosphor layer material does not include sulfides and heavy metals in the phosphor layer and thus has a less environmental impact and contributes to resource conservation, compared with the inorganic electroluminescent devices disclosed in Patent Citations 5 and 6 and Non-patent Citations 1 and 2. Such an inorganic electroluminescent device having an M-C—N—O based phosphor as a phosphor layer material has excellent durability and low power consumption, compared with organic electroluminescent devices; thus, it is desired to use such an inorganic electroluminescent device in image displays such as lightweight, large flat panel displays.

Conventional light emitting devices require a combination of LEDs made from different types of materials to realize emission of light of various colors or to obtain white or intermediate color. Since a different method and a different apparatus for the preparation of crystals are required for each type of materials, the conventional light emitting devices have a problem that tremendous amounts of cost, labor, and time and accumulation of techniques are required for the manufacture of the device. On the other hand, a peak top of an emission spectrum of the M-C—N—O based phosphor varies according to an amount of carbon contained; thus, it is desired to apply the M-C—N—O based phosphor to light emitting devices having a simple, less complex structure that can emit light of various colors. In view of the above conventional problems and social demands, the present invention has an object to provide an M-C—N—O based phosphor that can be easily produced from inexpensive materials at a relatively low temperature without using heavy metals and rare metals, exhibits a high emission intensity without using any special activator agent, and has an emission spectrum with a peak top that can be adjusted to change a color.

The present invention also has an object to provide a polymer dispersion or light emitting film comprising such an M-C—N—O based phosphor, and an inorganic electroluminescent device, light emitting device, or fluorescent tube having a phosphor layer comprising such an M-C—N—O based phosphor and having a simple structure that can emit light of various colors with a high luminous efficiency.

Technical Solution

The present inventors studied extensively and intensively and carried out various tests on M-C—N—O based phosphor devices that were variously adjusted, polymer dispersions or films comprising the devices, and inorganic electroluminescent devices, luminescent material devices, or fluorescent tubes having phosphor layers comprising the M-C—N—O based phosphors, and the present invention was accomplished.

The present invention provides:

[1] an M-C—N—O based phosphor comprising a group 13 element (M), carbon (C), nitrogen (N), and oxygen (O);

[2] the M-C—N—O based phosphor of [1], wherein a color changes according to an amount of carbon (C) contained therein;

[3] the M-C—N—O based phosphor of [1] or [2], wherein an amount of the group 13 element (M) contained is 1%<(M)<50% by mass; an amount of carbon (C) contained is 0.005%<(C)<10% by mass; an amount of nitrogen (N) contained is 1%<(N)<60% by mass; and an amount of oxygen (O) contained is 1%<(O)<75% by mass;

[4] the M-C—N—O based phosphor of any one of [1]-[3], wherein an amount of carbon (C) is 0.01-9.0% by mass;

[5] the M-C—N—O based phosphor of any one of [1]-[4], wherein the phosphor has a peak derived from a C=O bond;

[6] the M-C—N—O based phosphor of any one of [1]-[5], wherein a peak top of an emission spectrum of the phosphor varies in a wavelength range of 300-800 nm;

[7] the M-C—N—O based phosphor of any one of [1]-[5], wherein a peak top of an emission spectrum of the phosphor varies in a wavelength range of 400-650 nm;

[8] the M-C—N—O based phosphor of any one of [1]-[7], wherein the group 13 element (M) is boron (B);

[9] a method for preparing an M-C—N—O based phosphor, comprising heating and firing a mixture comprising a group 13 element-containing compound and a nitrogen-containing organic compound to obtain an M-C—N—O based phosphor;

[10] the method of [9], wherein the mixture further comprises a dispersing agent;

[11] the method of [9] or [10], wherein a solution or suspension containing the mixture is heated and fired to obtain the M-C—N—O based phosphor;

[12] the method of [9], wherein the heating and firing are carried out in the absence of oxygen;

[13] the method of any one of [9]-[11], wherein the heating and firing are carried out in the presence of oxygen;

[14] a polymer dispersion comprising an M-C—N—O based phosphor comprising a group 13 element (M), carbon (C), nitrogen (N), and oxygen (O);

[15] the polymer dispersion of [14], wherein the M-C—N—O based phosphor has a plurality of different emission peaks;

[16] a light emitting film comprising an M-C—N—O based phosphor comprising a group 13 element (M), carbon (C), nitrogen (N), and oxygen (O);

[17] an inorganic electroluminescent device comprising a phosphor layer between a rear electrode and a transparent electrode, the phosphor layer comprising an M-C—N—O based phosphor comprising a group 13 element (M), carbon (C), nitrogen (N), and oxygen (O);

[18] the inorganic electroluminescent device of [17], wherein the phosphor layer has a structure of a dispersion-type inorganic electroluminescent device;

[19] the inorganic electroluminescent device of [18], wherein the phosphor layer has a thickness of at least 200 nm and less than 30 μm;

[20] the inorganic electroluminescent device of [17], wherein the phosphor layer has a structure of a thin-film inorganic electroluminescent device;

[21] the inorganic electroluminescent device of [18], wherein the phosphor layer comprises the M-C—N—O based phosphor having an average particle size of at least 1 nm and not greater than 10 μm;

[22] a light emitting device, which emits light through a phosphor layer comprising an M-C—N—O based phosphor comprising a group 13 element (M), carbon (C), nitrogen (N), and oxygen (O);

[23] the light emitting device of [22], wherein an emission source is a light emitting diode or laser diode; and

[24] a fluorescent tube, which emits light through a phosphor layer comprising an M-C—N—O based phosphor comprising a group 13 element (M), carbon (C), nitrogen (N), and oxygen (O).

Advantageous Effects

The M-C—N—O based phosphor of the present invention can be easily produced from inexpensive materials at a relatively low temperature without using heavy metals and rare metals. Also, the M-C—N—O based phosphor of the present invention can emit light of various colors according to an amount of carbon contained.

The M-C—N—O based phosphor of the present invention can be used to produce an inorganic electroluminescent device (hereinafter, inorganic EL device) having the M-C—N—O based phosphor in a phosphor layer to emit light of various colors.

When excited by excitation light from an LED or laser diode, the M-C—N—O based phosphor of the present invention easily emits light of a color different from that of the LED or laser diode. Thus, a conventional LED or laser diode can be used to produce light emitting devices that emit light of various colors that were not previously obtained by using such a LED or laser diode.

Further, when ultraviolet light from a fluorescent tube is used to induce emission of light from the M-C—N—O based phosphor of the present invention, an improvement in efficiency of the fluorescent tube can be achieved and also color of the fluorescent tube can be changed easily.

BEST MODE FOR CARRYING OUT THE INVENTION

Figure 1:
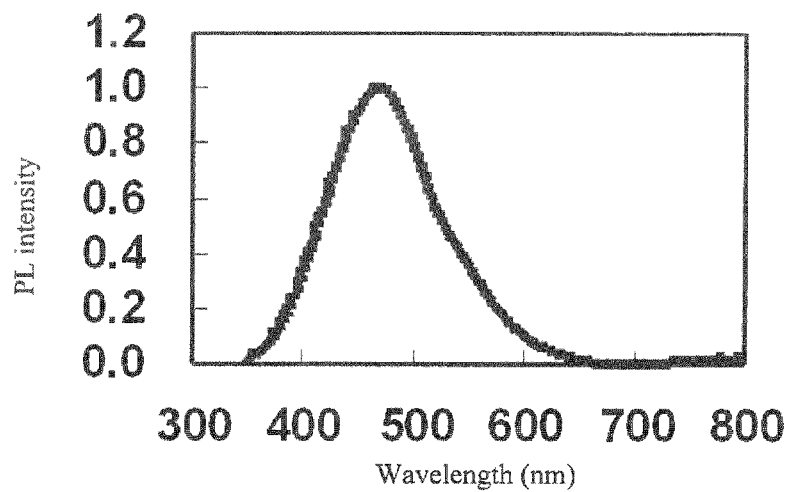
FIG. 1 An ultraviolet excitation-emission spectrum of a phosphor obtained in Example 1.

An M-C—N—O based phosphor of the present invention essentially comprises a group 13 element (M), carbon (C), nitrogen (N), and oxygen (O), and color of the phosphor changes according to an amount of carbon (C) contained.

It is preferable that an amount of the group 13 element (M) contained in the phosphor of the present invention be $1\%<(M)<50\%$ by mass, an amount of carbon (C) contained in the phosphor of the present invention be $0.005\%<(C)<10\%$ by mass, an amount of nitrogen (N) contained in the phosphor of the present invention be $1\%<(N)<60\%$ by mass, and an amount of oxygen (O) contained in the phosphor of the present invention be $1\%<(O)<75\%$ by mass. It is more preferable that $5\%<(M)<49\%$ by mass, $0.01\%<(C)<9\%$ by mass, $1.5\%<(N)<58\%$ by mass, and $5\%<(O)<68\%$ by mass. Substantially, $(M)+(C)+(N)+(O)=100\%$. In view of fluorescent light intensity, the phosphor of the present invention preferably has a peak derived from a C=O bond. Peaks derived from C=O bonds can be observed by X-ray photoelectron spectroscopy (XPS).

As described above, the amount of carbon in the M-C—N—O based phosphor of the present invention may be changed to shift an emission wavelength of the phosphor and to produce emission of light of various fluorescent colors from the phosphor. Practically, a peak top of an emission spectrum of the M-C—N—O based phosphor of the present invention preferably varies in the wavelength range of 300-800 nm. When emphasis is placed on the use of the visible light range, a phosphor having an emission spectrum with a peak top that varies in the wavelength range of 400-650 nm is more useful.

Carbon (C) is preferably contained in an amount of 0.005%-10% by mass. An excessively small amount of carbon (C) is not preferred, because this results in emission of light having a significantly short wavelength as well as lower intensity. An excessively large amount of carbon (C) is not preferred, because this results in not only a lower yield due to formation of impurities such as amorphous carbon but also absorption of emission energy by excess carbon. Accordingly, carbon is more preferably contained in an amount within the range of 0.01% to 9.0%.

The M-C—N—O phosphor of the present invention can be obtained by mixing a group 13 element-containing compound with a nitrogen-containing organic compound and then firing the mixture in a heating-firing furnace to produce a desired M-C—N—O based phosphor. The group 13 element-containing compound for use in the present invention is not particularly limited, and may be any compound comprising a group 13 oxide as a basic framework. Examples of compounds that can be used include boric acid, boric anhydride, derivatives of boric acid, such as esters, amides and ammonium salts, aluminic acid and derivatives of aluminic acid, such as esters, amides and ammonium salts, aluminum hydroxide, alumina, gallium hydroxide, gallium oxide, indium hydroxide, and indium oxide. In view of efficiencies in the production of the M-C—N—O based phosphor, availability of materials, and stability of materials, it is preferable to use boric acid, boric anhydride or ammonium salts of boric acid, aluminum hydroxide, gallium hydroxide or gallium oxide hydrate, or indium hydroxide. It is also possible to use those compounds that are prepared by hydrolyzing other equivalent hydrochlorides, sulfates, or the like with a basic solution. Boric acid (B) is especially preferred.

The nitrogen-containing organic compound for use in the present invention is not particularly limited, but may be any compound that decomposes to produce ammonia. Examples of nitrogen-containing organic compounds that can be used include: carbamide (i.e., urea); carbamates, such as methyl carbamate and ethyl carbamate; amides, such as formamide and acetamide; lactams, such as epsilon-caprolactam, gamma-butyrolactam, and N-methylpyrrolidone; and ammonium salts, such as ammonium formate and ammonium acetate. In view of effects of incorporation of nitrogen into the M-C—N—O based phosphor, ready availability, and the like, carbamide, amides, and ammonium salts are preferred; in view of economical efficiency and ease of handling, carbamide is especially preferred.

In the present invention, the mixture of the group 13 element-containing compound and the nitrogen-containing organic compound may further comprise a dispersing agent. The dispersing agent not only serves as a source of carbon for the M-C—N—O based phosphor but also facilitates reaction of the group 13 element-containing compound with the nitrogen-containing organic compound. When any of the below-mentioned solvents is used, the dispersing agent also improves dispersibility of the boron-containing compound and the nitrogen-containing organic compound in the solvent so that preferential precipitation of only one of those compounds can be prevented when the solvent volatilizes. The dispersing agent to be used is not particularly limited, and various dispersing agents can be used, but it is preferable to use a dispersing agent having high affinity especially to the group 13 element-containing compounds. Preferably, the dispersing agent has a boiling point that is higher than a temperature at which ammonia is produced by decomposition of the nitrogen-containing organic compound.

Examples of compounds having high affinity to the group 13 element-containing compounds include: polyethers, such as polyethylene glycol (PEG), polyethylene glycol dimethyl ether, and polyethylene oxide; polyamides, such as polyvinyl pyrrolidone; macromolecular compounds, such as hydroxyl polymers such as polyvinyl glycerin and polyvinyl alcohol; polyalcohols, such as ethylene glycol, 1,2-propanediol, 1,3-propanediol, 1,2-butanediol, 1,4-butanediol, glycerin, diethylene glycol, triethylene glycol, and tetraethylene glycol; ethers, such as dimethoxyethane, 1,2-propanediol dimethyl ether, 1,3-propanediol dimethyl ether, 1,2-butanediol dimethyl ether, 1,4-butanediol dimethyl ether, glycerin trimethyl ether, diethylene glycol dimethyl ether, triethylene glycol dimethyl ether, tetraethylene glycol dimethyl ether, diethoxyethane, 1,2-propanediol diethyl ether, 1,3-propanediol diethyl ether, 1,2-butanediol diethyl ether, 1,4-butanediol diethyl ether, glycerin triethyl ether, diethylene glycol diethyl ether, triethylene glycol diethyl ether, tetraethylene glycol diethyl ether, and tetraethylene glycol diethyl ether; and lactams such as N-methylpyrrolidone. In view of ready availability, carbon incorporation effects, and the like, it is prefer-
able to use a macromolecular compound, such as polyethylene glycol, or a polyalcohol, such as ethylene glycol and glycerin.

In the present invention, the M-C—N—O based phosphor can be obtained by heating and firing the mixture, which may optionally comprise the dispersing agent. Alternatively, the M-C—N—O based phosphor can be obtained by dissolving or suspending the mixture in the solvent, and then heating and firing the solution or suspension.

The solvent is not particularly limited, and any solvent may be used that can dissolve the group 13 element-containing compound and the nitrogen-containing organic compound and can maintain dispersibility of those compounds. Specifically, water and alcohols, such as methanol and ethanol, can be used. In view of safety in use, explosiveness, and the like, it is preferable to use water.

It is important that the solvent to be used contain no impurity. Especially contamination of the solvent with alkali metals and alkali earth metals is unfavorable, because there is concern that alkali metals and alkali earth metals react with the group 13 element-containing compound to cause structural changes, which may affect emission of light. Contamination of the solvent with heavy metals is also unfavorable, because there is concern that heavy metals may have an effect on formation of a structure of the M-C—N—O based phosphor. Contamination of the solvent with halogens or the like is unfavorable, because halogens expedite decomposition of the nitrogen-containing organic compound and inhibit incorporation of nitrogen into the M-C—N—O based phosphor. Accordingly, preferably a total amount of these impurities contained is 5000 ppm or smaller, more preferably 1000 ppm or smaller.

Amounts of the group 13 element-containing compound and nitrogen-containing organic compound to be used cannot be generally specified, because the amounts depend on types of compounds to be used, firing temperature and time, and the like, but 10-1500 parts by weight, preferably 50-1200 parts by weight, of the nitrogen-containing organic compound is generally used with respect to 100 parts by weight of the group 13 element-containing compound.

An amount of the dispersing agent to be used is not particularly limited, and cannot be generally specified, because it depends on a type of a compound to be used, firing temperature and time, and the like. However, it is generally preferable to use 1-200 parts by weight, preferably 5-190 parts by weight, of the dispersing agent with respect to 100 parts by weight of the group 13 element-containing compound.

An amount of the solvent to be used in the present invention is not particularly limited, and cannot be generally specified, because it depends on a type of a compound to be used, firing temperature and time, and the like. However, it is generally preferable to use 1-50000 parts by weight, more preferably 10-10000 parts by weight, of the solvent with respect to 100 parts by weight of the group 13 element-containing compound. Use of the solvent in an excessively large amount is uneconomical, because a longer period of time and a greater heat quantity are required to remove the solvent. Thus, it is more preferable to use 20-5000 parts by weight of the solvent.

As described above, the mixture of the group 13 element-containing compound and the nitrogen-containing organic compound, and optionally a dispersing agent, or the solution or suspension prepared by dissolving the mixture in the solvent is heated and fired according to the present invention. A mixing method for the preparation of the mixture, or the solution or suspension prepared by dissolving the mixture in the solvent is not particularly limited. For example, a mixing method using a ball mill, turbo mill, jet mill, mortar, or the like can be used for solid-solid mixing. In view of homogeneity of the group 13 element-containing compound, the nitrogen-containing organic compound and the dispersing agent, it is preferable to perform liquefaction, optionally followed by solidification by removal of the solvent by distillation.

In the present invention, various methods can be employed to carry out the heating and firing. The heating and firing may be carried out by any method that enables pyrolysis of the mixture or the solution containing the mixture to take place. Examples of heating and firing methods that can be used in the present invention include those using a heating-firing furnace with a movable bed, such as a rotary kiln and a conical kiln, those using heating-firing furnace with a continuous fixed bed, such as a roller hearth furnace and a pusher furnace, those using a heating-firing furnace with a batch fixed bed, such as an atmosphere adjusting furnace, or those using a pyrolysis furnace such as a spray or atomization method.

The heating and firing methods are not particularly limited; the temperature may be increased to a target temperature in a single step, or may be increased through multiple steps. When the mixture is dissolved in the solvent, it is not preferable to increase the temperature at an excessively fast rate, because sudden boiling (i.e., bumping) may occur when heat transfer is poor. Thus, in the case of increasing the temperature in a single step, the temperature is generally increased by 1-30° C. per minute, preferably 5-25° C. per minute. In the case of increasing the temperature through multiple steps, it is generally preferable to increase the temperature as follows, though it should be understood that an appropriate method is selected according to a type of a solvent to be used: the temperature is increased by 1-30° C. per minute until it reaches a boiling point, maintained at or near the boiling point for 10-120 minutes, increased by 1-30° C. per minute until it reaches a decomposition temperature of the nitrogen-containing organic compound, maintained, when necessary, for 10-120 minutes, and then increased by 1-30° C. per minute until it reaches a target temperature.

A firing temperature cannot be generally specified, because it depends on the amount of the nitrogen-containing organic compound used, the amount of the dispersing agent used, and the like, but the firing temperature is generally set within the range of 300° C. to 1000° C. An excessively high temperature is likely to result in carbon vacancies and decreased brightness or a deviation from a desired wavelength. On the other hand, an excessively low temperature does not result in improvement in brightness, because it does not allow crystallization to proceed. Accordingly, the firing may be carried out at a temperature of 320° C. to 900° C., more preferably 350° C. to 850° C.

A period of maintaining the firing temperature cannot be definitely determined, because it depends on the amount of the nitrogen-containing organic compound used and the amount of the dispersing agent used, but the period is generally set within the range of 0-180 minutes. An excessively short period is not preferred, because it may result in insufficient heat transfer, which is likely to arise a problem concerning homogeneity. An excessively long period is not preferred, because it may result in carbon vacancies. Accordingly, the firing temperature may be maintained for a period of 1-150 minutes, more preferably 5-120 minutes.

When the dispersing agent or solvent is added to the mixture of the group 13 element-containing compound and the nitrogen-containing organic compound, the heating and firing may be carried out in the presence of an inert gas (in the absence of oxygen) or in an atmosphere (in the presence of oxygen). However, in the case of heating and firing the mixture without addition of the dispersing agent or solvent, the heating and firing may be carried out in the absence of oxygen. When large amounts of the nitrogen-containing organic compound, dispersing agent, and solvent are used, the heating and firing may be preferably carried out in the presence of oxygen to remove excess carbon by combustion.

A concentration of oxygen is not particularly limited, but typically may be in the range of 1% to 30%, more preferably in the range of 3% to 25%. The firing atmosphere can be adjusted through multiple stages. For example, when the temperature is 400° C. or lower, at which the combustion level is low, the firing may be carried out in an atmosphere of an inert gas, such as nitrogen, in view of the risks of explosions by ammonia produced by decomposition of the nitrogen-containing organic compound. On the other hand, when the temperature is 400° C. or higher, at which the combustion level is high, the firing may be carried out in the presence of oxygen. During the firing step, further formation of carbon vacancies can be inhibited by using an inert gas atmosphere as the firing atmosphere while maintaining the target temperature. The foregoing procedures can be performed in a gas stream or in a closed atmosphere.

The rate of decreasing the temperature is not particularly limited. However, an excessively fast rate is unfavorable, because it requires a special firing furnace which is likely to impose unfavorable burden on facilities. Accordingly, the temperature is preferably decreased by 1-80° C. per minute, more preferably 2-50° C. per minute.

The atmosphere in which the temperature is to be decreased is not particularly limited; the temperature may be decreased in an atmosphere of an inert gas, such as nitrogen and argon, or in the presence of oxygen. In view of safety and the like, the temperature is preferably decreased in an inert gas. When the temperature is 300° C. or lower, moisture adheres to a target phosphor surface; thus, the temperature is preferably decreased in dry gas.

Particles of the M-C—N—O based phosphor obtained by the above methods may take various shapes, and may include, for example, primary particles having an average particle size of 1 nm to 10 μm, as measured by a light scattering method, and aggregates of the primary particles in the range of submicrons to several microns, as measured by a light scattering method. In the present invention, these M-C—N—O based phosphor particles may be used directly, or may be ground into finer particles for a particular use. To grind the particles, a ball mill, jet mill, or turbo mill may be used. Particles prepared using a binder may also be used. However, in view of dispersion efficiency and technical difficulty, it is preferable to use the M-C—N—O based phosphor particles in the range of 1 nm to 10 μm, preferably in the range of 5-20 nm.

The foregoing describes the M-C—N—O based phosphor of the present invention and the method for the production of the M-C—N—O based phosphor. The M-C—N—O based phosphor of the present invention is applicable to inorganic EL devices, light emitting devices, fluorescent lamps, and the like, in which the M-C—N—O based phosphor used emits light of various colors with high energy efficiency. The polymer dispersion suitable for use in the production of the inorganic EL devices, light emitting devices, or fluorescent lamps is described below.

A dispersion prepared by dispersing the M-C—N—O based phosphor into a dispersion comprising polymers of resins listed below may be used as the polymer dispersion. Specifically, polymers of the following resins can be used: cyanoethylpullulan and cyanoethylcellulose; polyfluoride resins, such as polytetrafluoroethylene, poly(trifluoroethylene), and poly(vinylidene fluoride); polycarbonate resins;

polyolefin resins, such as polyethylene and polypropylene; polystyrene resins; polyacrylic acid ester resins, such as poly (methyl acrylate) and poly(methyl methacrylate); polyacrylamide resins; polyester resins, such as polyethylene terephthalate and polybutylene terephthalate; polyamide resins, such as 6-nylon and 6,6-nylon; dicyclopentadiene ring-opening polymer hydrogenation resins; hydrogenated styrene-conjugated diene copolymer resins, such as hydrogenated styrene-butadiene copolymer and hydrogenated styrene-isoprene copolymer; polycarbonate resins; hydroxyl group-containing resins, such as polyvinyl alcohol, polyvinyl alcohol-ethylene copolymer resins, and polyvinyl acetal resins; polyacetal resins; and halogen based resins, such as polyvinyl chloride and polyvinylidene chloride. Polymers of resins that are curable by ultraviolet light, such as silicone resins and epoxy resins, may also be used. They may be used singly or in combination.

Among the above resins, those having a relatively high permittivity, such as cyanoethylpullulan, cyanoethylcellulose, and polyvinylidene fluoride, are preferred. Resins to be used for the present invention are preferably selected from polycarbonates, polyamides, polyacrylic acid esters, polymethacrylic acid esters, polyacrylamides, polymethacrylamides, and thermosetting resins obtained from silicone resins or epoxy resins.

The M-C—N—O based phosphor is dispersed into such a dispersion to prepare a polymer dispersion containing the M-C—N—O based phosphor. The M-C—N—O based phosphor can be dispersed into the polymer dispersion by a dispersion method using a homogenizer, planetary kneader, roll kneader, ultrasonic dispersing apparatus, or the like.

The M-C—N—O based phosphor-containing polymer dispersion thus obtained can be suitably used in the production of dispersion-type inorganic EL devices described below. The following describes the dispersion-type inorganic EL device (hereinafter, dispersion-type EL device) of the present invention. Note that the dispersion-type EL device may have a known structure in which a phosphor layer is provided between conductive electrodes, at least one of which is a counterpart of an electrode having a light-transmitting transparent conductive film. Specific structures are as follows.

(Phosphor Layer)

The phosphor layer is formed using the polymer dispersion described above. Specifically, the phosphor layer is formed by application of the polymer dispersion onto a substrate by spin coating, dip coating, bar coating, or spraying and then dried by heating at 50-300° C. to form a layer with a desired thickness. Among the above application techniques, those applicable to any surface of any substrate to be printed, such as screen printing, and those capable of continuous application, such as slide coating, are preferred. For example, a dispersion prepared by dispersing fine phosphor and dielectric particles into a polymer solution having a high permittivity is applied through a screen mesh by using a screen printing technique. The thickness of the layer may be controlled by selecting a thickness of the mesh, an aperture ratio, and the number of applications. An area of the layer can be easily enlarged by changing a size of the screen.

A concentration of the M-C—N—O based phosphor in the polymer dispersion is not particularly limited, but it should be understood that the concentration depends the particle size of the M-C—N—O based phosphor. However, it is generally preferable that the concentration be in the range of 1-80% by weight; in view of dispersibility and efficient use of ultraviolet light, it is preferable to use in the range of 2-70% by weight. Preferably, the phosphor layer has a thickness of 300 nm to 30 μm, and particularly preferably 500 nm to 10 μm.

The wavelength of light to be emitted from the phosphor layer can be controlled by adjusting the amount of amide compounds to be added and the firing temperature, and thus any wavelength in the visible light range can be obtained. For example, a material that emits blue light of about 460 nm can be prepared by mixing boric acid with carbamide at a molar ratio of 1:1, optionally adding as a dispersion material 10% by weight of polyethylene glycol with respect to the mixture, and firing the resulting mixture in a crucible at 700° C. in an atmosphere.

In the phosphor layer described above, the M-C—N—O based phosphor is directly dispersed, but the M-C—N—O based phosphor may be coated with a non-light-emitting shell layer and then dispersed into the phosphor layer. For example, the products disclosed in Japanese patent No. 2756044 and U.S. Pat. No. 6,458,512 may be used, in which phosphors are coated with a non-light-emitting shell layer comprising a metal oxide or metal nitride and having a thickness of 0.01 μm or greater. Such coating may produce a waterproof, water-resistant phosphor layer.

Alternatively, the non-light-emitting shell layer may comprise an oxide, nitride, oxynitride, or a material having the same composition as that of the host phosphor particles but without a luminescent center, which may be produced on the phosphor particles.

To form the non-light-emitting shell layer, the following methods can be employed: vapor phase methods, such as laser abrasion, CVD, plasma CVD, and a combination of sputtering, resistance heating, or electron beam method with vapor deposition onto a running oil substrate; liquid phase methods, such as double decomposition, sol-gel process, ultrasonic chemical process, precursor pyrolysis reaction, inverse micelle process, a combination of these processes with high-temperature firing, hydrothermal synthesis, carbamide melting, and freeze drying; and spray pyrolysis.

(Dielectric Layer)

The dispersion-type EL device of the present invention may have a dielectric layer comprising a dielectric substance between the phosphor layer and the rear electrode. The dielectric substance may be in the form of a thin crystal layer, particles, or a combination thereof. The dielectric layer comprising the dielectric substance may be provided to one side or both sides of the phosphor particle layer. Any material that has a high permittivity, high insulation properties, and a high dielectric breakdown voltage can be used in the dielectric layer The dielectric substance is selected from metal oxides and metal nitrides. The dielectric substances to be used may include, for example, barium titanate, potassium niobate, lithium niobate, lithium tantalate, tantalum oxide, or alumina. These substances may be applied as a uniform layer by sputtering, vacuum vapor deposition, or the like, or as a layer having a structure of particles comprising an organic binder. In the case of the particles, it is preferable that the dielectric substance be adequately small with respect to a size of the phosphor particles. Specifically, it is preferable that the size of the dielectric substance be 1/1 to 1/100 of the size of the phosphor particles. The type of the binder, the method of dispersion into the binder, and the layer forming method may be the same as those for the phosphor layer.

(Transparent Conductive Layer)

Any commonly used transparent electrode materials may be used in the transparent conductive layer of the dispersion-type EL device of the present invention. Examples of transparent electrode materials to be used include metal oxides, such as tin doped tin oxide, antimony doped tin oxide, zinc doped tin oxide, fluorine doped tin oxide, and zinc oxide, materials having a multilayer structure in which a thin silver layer is sandwiched between layers having a high index of refraction, and conjugated polymers, such as polyaniline and polypyrrole. According to one embodiment of the present invention, tin oxide is preferably used as a main component of a surface of the transparent conductive layer, because it improves durability of the transparent conductive layer.

Preferably, the transparent conductive layer has a surface resistivity of 0.01 $\Omega/m^2$ to 100 $\Omega/m^2$, more preferably 0.02 $\Omega/m^2$ to 10 $\Omega/m^2$.

An amount of the applied transparent conductive substance is preferably 100% by mass to 10% by mass, more preferably 90% by mass to 15% by mass, with respect to the transparent conductive layer.

The transparent conductive layer can be formed by a vapor-phase method such as sputtering or vacuum vapor deposition. The transparent conductive layer can be formed by applying or screen-printing an ITO or tin oxide paste. It is also possible to form the layer by a thermal method such as spray pyrolysis. According to one embodiment of the present invention, a transparent film having higher thermal resistance is preferred.

(Intermediate Layer)

The dispersion-type EL device of the present invention may comprise a transparent electrode layer, a light emitting layer, and/or at least one intermediate layer between the rear electrode and the dielectric layer. The intermediate layer may comprise an organic macromolecular compound, an inorganic compound, or a combination thereof. Preferably, the intermediate layer has a thickness of 10 nm to 10 µm, more preferably 100 nm to 1 µm.

When the intermediate layer comprises an organic macromolecular compound, the macromolecular compound includes: polyethylene, polypropylene, polystyrene, polyesters, polycarbonates, polyamides, polyethersulfones, polyvinyl alcohol, polysaccharides such as pullulan, saccharose, and cellulose, vinyl chloride, fluorine rubber, polyacrylic acid esters, polymethacrylic acid esters, polyacrylamides, polymethacrylamides, silicone resins, cyanoethylpullulan, cyanoethylpolyvinyl alcohol, cyanoethylsaccharose, and mixtures thereof.

The intermediate layer can be formed by dissolving any of these organic macromolecular compounds in a suitable organic solvent, such as dichloromethane, chloroform, acetone, methyl ethyl ketone, cyclohexanone, acetonitrile, dimethylformamide, dimethylacetamide, dimethyl sulfoxide, toluene, and xylene, and then applying the mixture onto the transparent conductive layer or phosphor layer.

The intermediate layer may comprise an inorganic compound such as metal oxides (e.g., silicon dioxide) and metal nitrides. The method for forming the intermediate layer from an inorganic compound includes sputtering, CVD, or the like. When the intermediate layer comprises an inorganic compound, the intermediate layer preferably has a thickness of 10 nm to 1 µm, more preferably 10 nm to 200 nm.

(Rear Electrode)

Conductive materials can be used in the rear electrode from which no light is to be obtained. For example, metals, such as gold, silver, platinum, copper, iron, magnesium, and aluminum, or graphite can be used. An appropriate material is selected from these materials in view of a form of a device to be produced, a temperature during the production, and the like. These materials can be used singly or in combination.

A thickness of the electrode is not particularly limited, but it is generally preferable that the electrode have a thickness of 100 nm to 100 µm, more preferably 500 nm to 50 µm.

(Substrate)

The substrate material for use in the dispersion-type EL device of the present invention is not particularly limited, and may include any substrate that has adequate shielding properties to eliminate the effects of external moisture and oxygen. Materials having excellent shielding properties, such as glass and polyethylene terephthalate, are typically used for the substrate. A thickness of the substrate is not particularly limited. When the substrate is made of glass, it is generally preferable that the substrate have a thickness of 10 µm to 2 mm, more preferably 14 µm to 1 mm. When the substrate is made of polyethylene terephthalate or the like, the substrate preferably has a thickness of 10 µm to 1 mm, more preferably 15 µm to 500 µm.

The foregoing describes the dispersion-type EL device. Thin-film inorganic EL devices (hereinafter, thin-film EL device) can have the same structure as that of the dispersion-type EL device and can be produced by the same method as that for producing the dispersion-type EL device, except for the production of the phosphor layer. The phosphor layer of the thin-film EL device is formed as follows. The phosphor layer can be formed by directly subjecting to pyrolysis or electrostatic spray deposition the mixture of the group 13 element-containing compound and the nitrogen-containing organic compound and optionally the dispersing agent, or the solution or suspension containing the mixture. Alternatively, the phosphor layer can be formed by providing the M-C—N—O based phosphor, and subsequently subjecting it to a vapor phase process, such as sputtering and vacuum vapor deposition. Preferably, the phosphor layer has a thickness of 200 nm to 30 µm. Especially preferably the phosphor layer has a thickness of 200 nm to 1 µm.

The dispersion-type EL device or thin-film EL device comprises environmentally-friendly elements and can produce light of various, previously unavailable colors, while having a simple structure and retaining advantages of conventional inorganic EL devices. The polymer dispersion containing the M-C—N—O based phosphor of the present invention can be suitably used in the production of a light emitting device described below. The light emitting device, like the inorganic EL devices of the present invention, comprises environmentally-friendly elements and can produce light of various, previously unavailable colors, while having a simple structure and retaining advantages of conventional LEDs or laser diodes.

The light emitting device of the present invention may be produced by, for example, applying the polymer dispersion onto an outer or inner surface of a transparent resin section surrounding a light emitting section of an LED or laser diode, and then drying the solution. Alternatively, the light emitting device may be produced by applying the polymer dispersion directly onto a light emitting section of an LED or laser diode, and then drying the solution. The light emitting device of the present invention may be produced such that the M-C—N—O based phosphor is provided above or in front of the light emitting section of the LED or laser diode. Specifically, the M-C—N—O based phosphor may be provided such that the phosphor is efficiently excited by excitation light from the LED or laser diode.

For example, an ethylene tetrafluoride resin film to which the polymer dispersion is applied may be attached to a light emitting device of an LED, or alternatively a film of the polymer dispersion may be prepared and attached to a light emitting device of an LED. These films function as light emitting films that emit light when excited by excitation light from the light emitting section of the LED. Examples of methods for forming a film from the polymer dispersion include casting or stretching the polymer dispersion to form a film.

The light emitting device of the present invention may be directly produced in the production of the LED or laser diode by dispersing the M-C—N—O based phosphor into a polymer that serves as a material for protecting the LED or laser diode, and then molding the resulting dispersion.

Various LEDs or laser diodes can be used in the light emitting device of the present invention, but LEDs or laser diodes that emit ultraviolet light, such as GaN based crystals, are preferred. The use of such LEDs or laser diodes makes it possible to produce a light emitting device having high energy efficiency.

In the production of the light emitting device of the present invention, it is generally preferable that the concentration of the M-C—N—O based phosphor in the polymer dispersion be in the range of 1-80% by weight, but it should be understood that the concentration depends on the composition and the particle size of the M-C—N—O based phosphor. In view of dispersibility of the phosphor particles and efficient use of ultraviolet light, the concentration of the M-C—N—O based phosphor in the polymer dispersion is preferably within the range of 2-70% by weight.

A thickness of the phosphor layer to be excited by the LED or laser diode is not particularly limited, regardless of conditions and methods of forming the phosphor layer. However, an excessively thick phosphor layer is likely to have decreased luminous efficiency due to light scattering by particles, and an excessively thin phosphor layer may result in inefficient use of ultraviolet light. Accordingly, the phosphor layer preferably has a thickness of 10-500 μm.

As described above, the LED or laser diode that emits light of various colors can be obtained by providing the M-C—N—O based phosphor of the present invention above or in front of a conventional LED or laser diode such that the LED or laser diode may emit light through the M-C—N—O based phosphor. According to an embodiment of the present invention, organic combination of the LED or laser diode and the M-C—N—O based phosphor can provide a luminescent body that is small and lightweight and has a long lifetime and low power consumption. Also, the LEDs or laser diodes of previously unavailable colors can be easily obtained, which retain advantages of the LEDs or laser diodes.

The LED or laser diode of various colors can be easily produced simply by changing the materials of the M-C—N—O based phosphor to be provided to the light emitting device of the present invention without changing a structure of the LED or laser diode. Thus, the present invention solves the problem that the production of the LED or laser diode of various colors requires a different material for each color of light to be emitted and a different apparatus for each material. The present invention requires fewer apparatuses and simplifies the production steps, and accordingly has an advantage that production costs are significantly reduced.

Since characteristics of the LED or laser diode that emits excitation light do not change even when the materials of the phosphor are changed, it is possible to easily obtain LEDs or laser diodes with the same electrical characteristics and different fluorescent colors. This makes it possible to use the same driving circuit to cause emission of light when devices that emit light of different colors are used, while it was conventionally required to change the driving circuit for each characteristic of the LED or laser diode; thus, the driving system can be simplified.

The light emitting device of the present invention is applicable to the uses of LEDs or laser diodes that are widely used as display devices. Furthermore, according to of the present invention, the light emitting device that emits light of an intermediate color or white light can be easily obtained. Thus, the light emitting device of the present invention is further applicable to display lamps and illuminating lamps of instruments that require a large number of colors, though conventional LEDs or laser diodes were not applicable.

The foregoing describes the light emitting device of the present invention. A fluorescent tube having high energy efficiency can be easily produced by using the polymer dispersion comprising the M-C—N—O based phosphor, as described below. Specifically, the fluorescent tube of the present invention is produced by, for example, applying the polymer dispersion onto a surface of a fluorescent tube and then drying the dispersion. The fluorescent tube, like the light emitting device described above, may be produced such that ultraviolet light from the fluorescent tube can efficiently irradiate the phosphor layer comprising the M-C—N—O based phosphor that is provided above the surface of the tube. Thus, the fluorescent tube may be any tube that emits ultraviolet light; such tubes that can be referred to as any name can be used, e.g., fluorescent lamps, cold-cathode tubes, and ultraviolet lamps. Application of the fluorescent tube to general lamps provides a lamp that can emit fluorescent light with an improved efficiency.

In the production of the fluorescent tube of the present invention, the concentration of the M-C—N—O based phosphor in the polymer dispersion may be the same as that used in the production of the light emitting device described above. The thickness of the phosphor layer to be excited by excitation light emitted from the fluorescent tube is not particularly limited. However, an excessively thick phosphor layer is likely to have lower luminous efficiency due to light scattering by particles, and an excessively thin phosphor layer may result in inefficient use of ultraviolet light. Thus, the phosphor layer preferably has a thickness of 10-500 μm. The phosphor layer can be produced by various methods as in the case of the inorganic EL device; for example, the phosphor layer can be produced by attaching the light emitting film.

The foregoing describes the fluorescent tube of the present invention. The present invention can provide a fluorescent tube having high energy efficiency. Further, the present invention permits use of near-ultraviolet radiation that is conventionally unused, and therefore enables the production of environmentally-friendly fluorescent tubes that not only improve energy efficiency but also efficiently utilize radiation that is likely to have potential adverse effects on human bodies when used in short distances. Further, the fluorescent tube of colors that cannot be realized by conventional fluorescent lamps, cold-cathode tubes, and ultraviolet lamps can be easily produced according to the present invention.

The following non-limiting Examples further illustrate the present invention. Examples of the M-C—N—O based phosphor of the present invention are described first. Physical properties were measured by the following methods using the following apparatuses.

(1) Measurement test of ultraviolet excitation-emission spectra of a wavelength of 300 nm: Shimadzu RF-5300PC (2) Measurement test by XPS: KRATOS AXIS-HS (3) Measurement of amounts of carbon and nitrogen contained: Perkin Elmer 2400 series II CHNS/O elemental analyzer.

(4) Measurement of an amount of a group 13 element: Nippon Jarrell-Ash ICP atomic emission spectrometer IRIS AP

Example 1

To 1.53 g (0.025 mol) of boric acid ($H_3BO_3$, Wako Pure Chemical Industries, Ltd.) and 15.3 g (0.25 mol) of carbamide [$(NH_2)_2CO$] (Wako Chemical, Ltd.) in a 300-ml beaker, 33.3 g of ultrapure water was added and stirred with a hot stirrer (revolution per minute: 500 rpm) to dissolve. To the mixture, 0.5 g of PEG (molecular weight: 20000, Wako Chemical, Ltd.) was added and stirred with the hot stirrer at 500 rpm. The resulting material solution was transferred into a crucible. In a heating furnace, in which the temperature was increased at a rate of 20° C./minute, the material solution in the crucible was fired at 800° C. for 30 minutes.

The ultraviolet excitation-emission spectrum of the phosphor obtained in Example 1 is shown in FIG. 1. In FIG. 1, the horizontal axis indicates a wavelength, and the vertical axis indicates a PL intensity (photoluminescence (PL) intensity). The foregoing explanations of the axes are also the case with the following figures.

Figure 2:
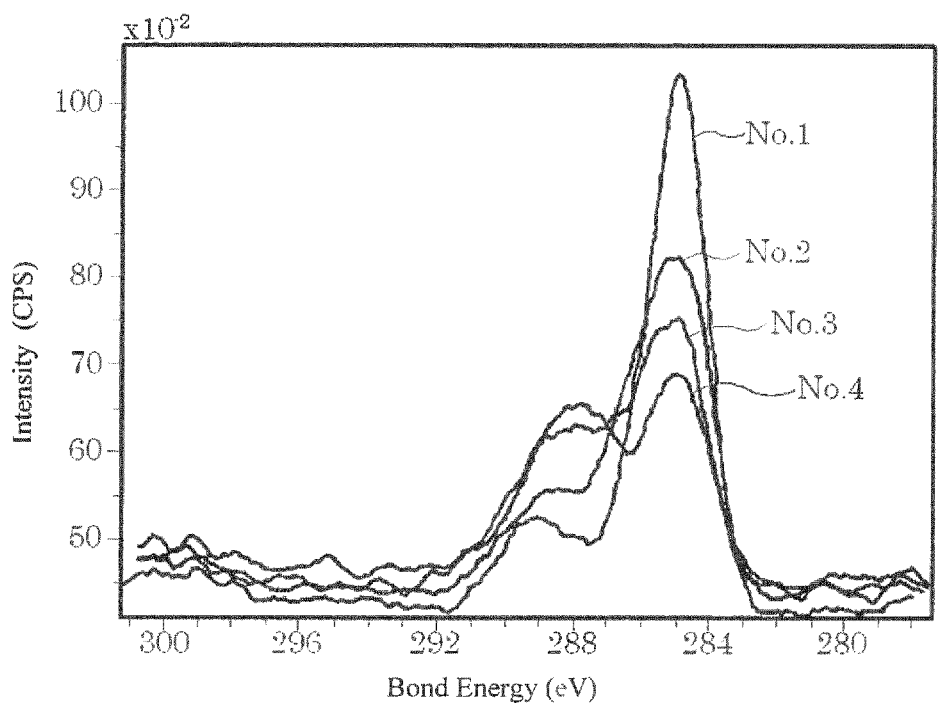
FIG. 2 Results of measurement by XPS obtained in Examples 1, 2, 3, and 4.

The result of XPS measurement performed on the phosphor obtained in Example 1 is shown in FIG. 2 (No. 1). The result shows that the phosphor of the present invention has a peak at 292-286 eV derived from C=O.

Amounts of elements contained in the phosphor obtained in Example 1 are shown in Table 1, and a peak-top emission wavelength is shown in Table 2.

Example 2

Figure 3:
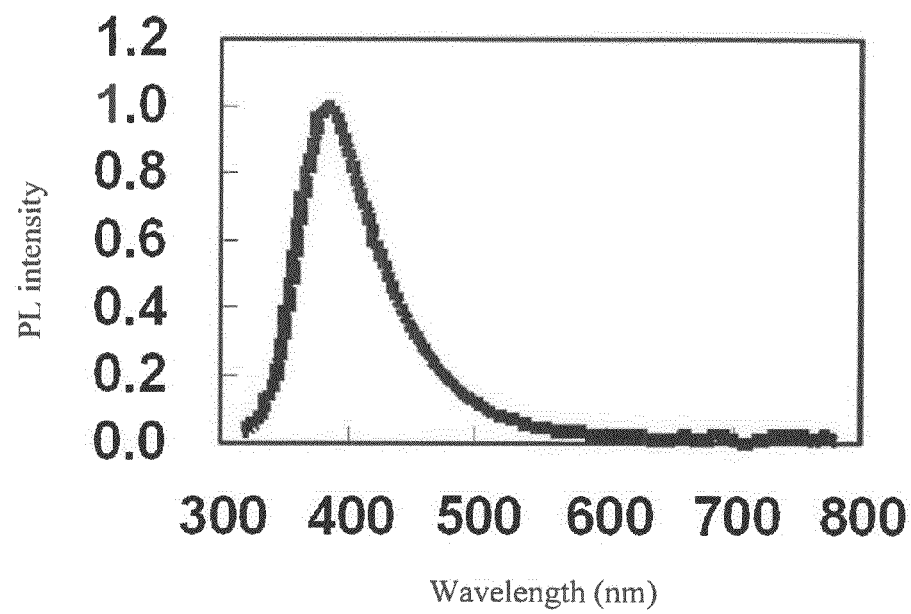
FIG. 3 An ultraviolet excitation-emission spectrum of a phosphor obtained in Example 2.

The procedure of Example 1 was repeated, except that the firing temperature was 900° C. Amounts of elements contained are shown in Table 1, and a peak-top emission wavelength is shown in Table 2. The result of XPS measurement performed on the phosphor is shown in FIG. 2 (No. 2). The ultraviolet excitation-emission spectrum is shown in FIG. 3.

Example 3

Figure 4:
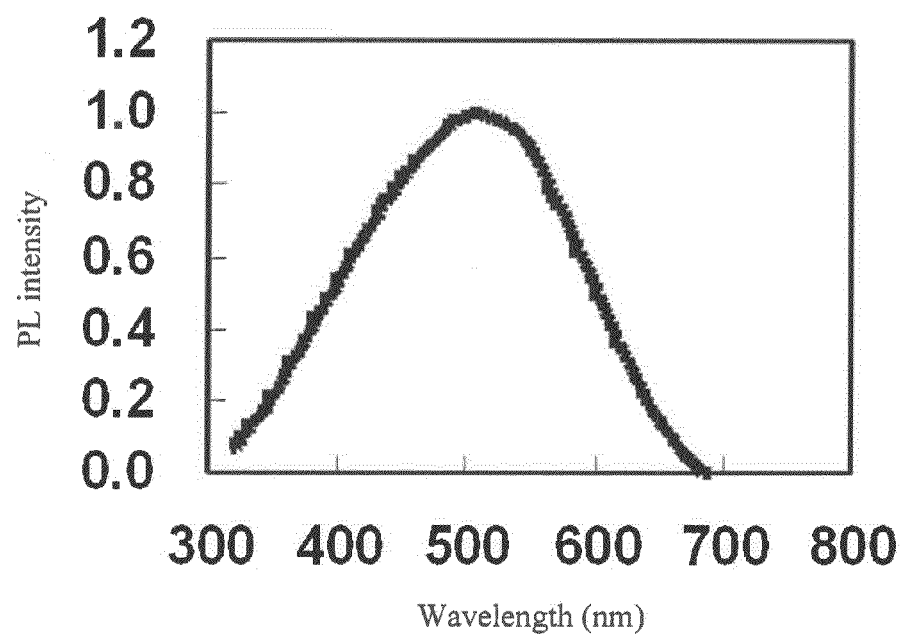
FIG. 4 An ultraviolet excitation-emission spectrum of a phosphor obtained in Example 3.

The procedure of Example 1 was repeated, except that 1.0 g of PEG was used instead of 0.5 g of PEG Amounts of elements contained are shown in Table 1, and a peak-top emission wavelength is shown in Table 2. The result of XPS measurement performed on the phosphor is shown in FIG. 2 (No. 3). The ultraviolet excitation-emission spectrum is shown in FIG. 4.

Example 4

Figure 5:
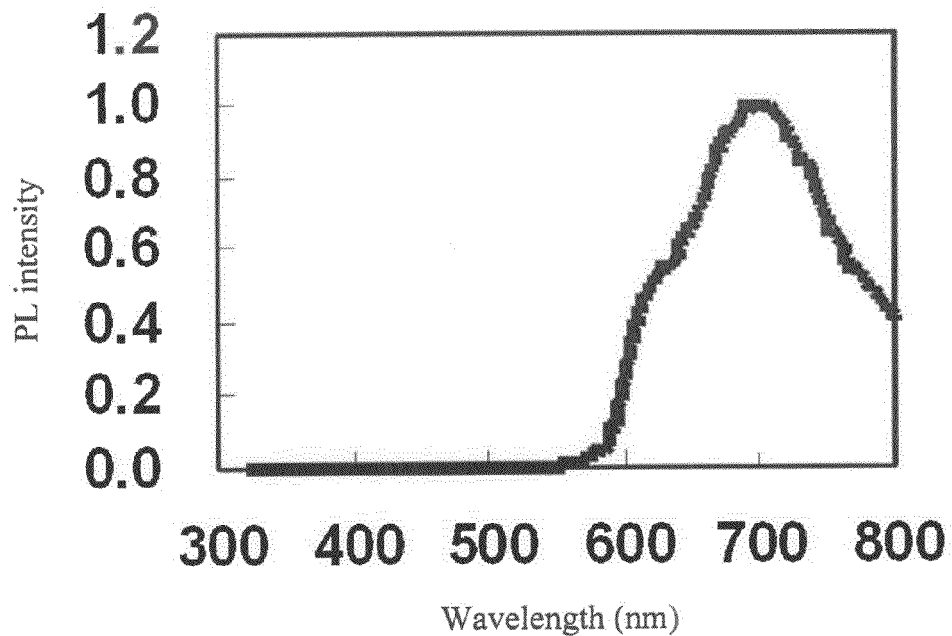
FIG. 5 An ultraviolet excitation-emission spectrum of a phosphor obtained in Example 4.

The procedure of Example 1 was repeated, except that 1.375 g of PEG was used instead of 0.5 g of PEG Amounts of elements contained are shown in Table 1, and a peak-top emission wavelength is shown in Table 2. The result of XPS measurement performed on the phosphor is shown in FIG. 2 (No. 4). The ultraviolet excitation-emission spectrum is shown in FIG. 5.

TABLE 1

| | Amount of boron contained (%) | Amount of carbon contained (%) | Amount of nitrogen contained (%) | Amount of oxygen contained (%) |
|---|---|---|---|---|
| Example 1 | 29.2 | 0.4 | 9.0 | 61.4 |
| Example 2 | 27.3 | 1.0 | 20.6 | 48.7 |
| Example 3 | 25.2 | 2.2 | 16.0 | 56.6 |
| Example 4 | 18.8 | 4.5 | 5.3 | 71.4 |

TABLE 2

| | Peak-top wavelength (nm) |
|---|---|
| Example 1 | 387 |
| Example 2 | 470 |
| Example 3 | 502 |
| Example 4 | 706 |

Example 5

Figure 6:
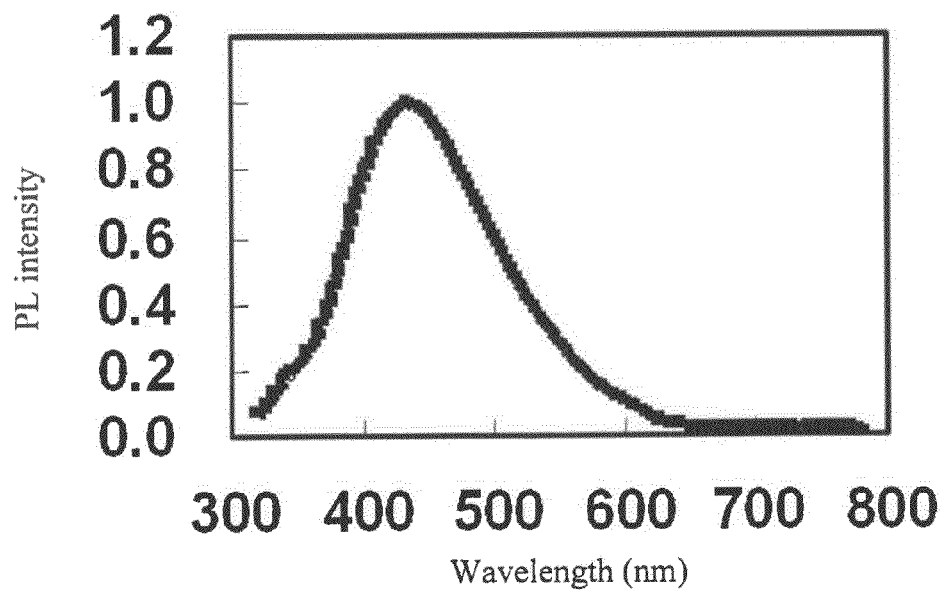
FIG. 6 An ultraviolet excitation-emission spectrum of a phosphor obtained in Example 5.

In a mortar, 0.3 g of boric acid, 3.0 g of carbamide, and 0.1 g of PEG (molecular weight: 20000) were sufficiently ground and mixed. The mixture was placed in an alumina boat. Then, the alumina boat was placed in a cylindrical tubular furnace, heated to 800° C. in the atmosphere at a rate of 20° C. per minute, maintained at 800° C. for 20 minutes, and then allowed to cool down in nitrogen. The ultraviolet excitation-emission spectrum of the resulting phosphor is shown in FIG. 6.

Example 6

Figure 7:
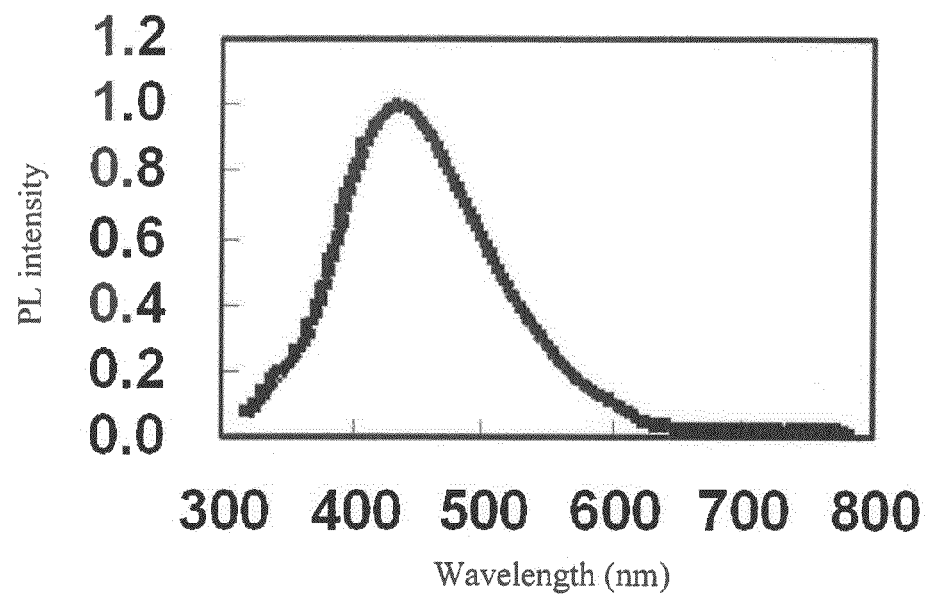
FIG. 7 An ultraviolet excitation-emission spectrum of a phosphor obtained in Example 6.

The ground mixture of Example 5 was added to 20 g of ion exchange water and dissolved. The resulting solution was placed under a reduced pressure of 70 Ton and heated at 100° C. to evaporate the added water. Then, a mixture paste was obtained. The resulting paste was placed in an alumina boat. Then, the alumina boat was placed in a cylindrical tubular furnace, heated to 800° C. in the atmosphere at a rate of 20° C. per minute, maintained at 800° C. for 20 minutes, and then allowed to cool down in nitrogen. The ultraviolet excitation-emission spectrum of the resulting phosphor is shown in FIG. 7.

Example 7

Figure 8:
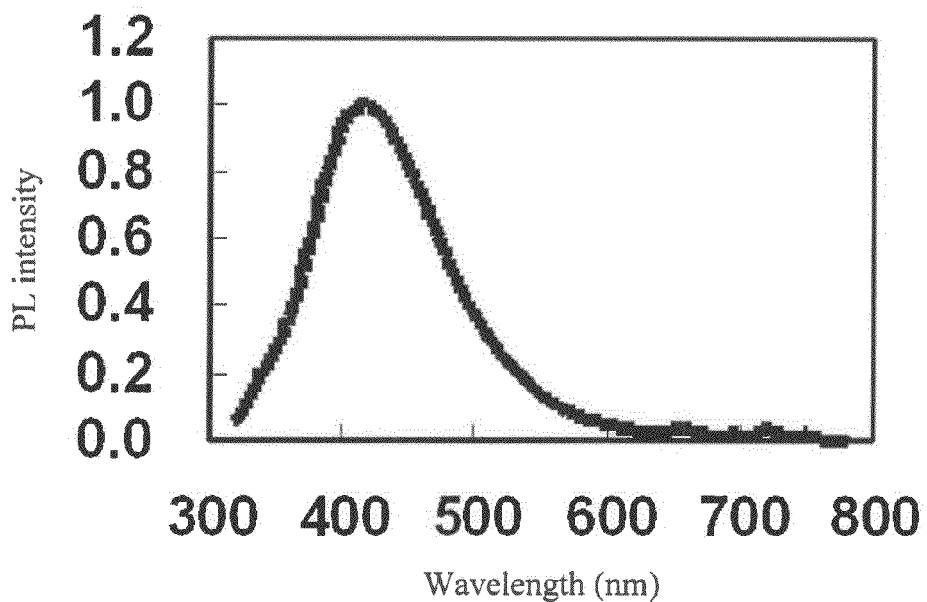
FIG. 8 An ultraviolet excitation-emission spectrum of a phosphor obtained in Example 7.

The procedure of Example 5 was repeated, except that tetraethylene glycol was used in place of PEG. The ultraviolet excitation-emission spectrum of the resulting phosphor is shown in FIG. 8.

Example 8

Figure 9:
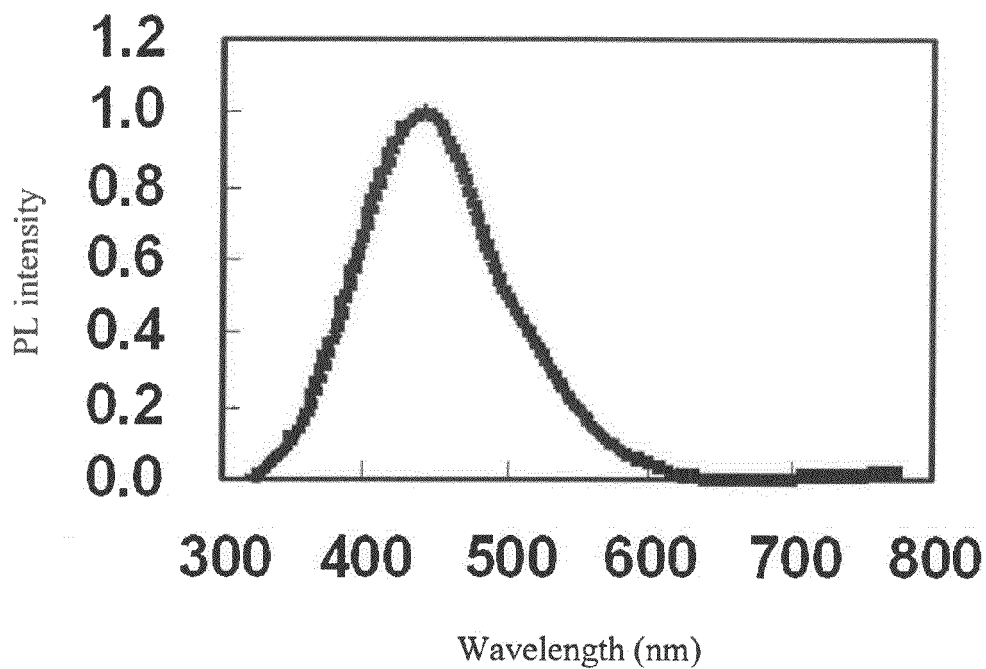
FIG. 9 An ultraviolet excitation-emission spectrum of a phosphor obtained in Example 8.

The procedure of Example 5 was repeated, except that glycerin was used in place of PEG. The ultraviolet excitation-emission spectrum of the resulting phosphor is shown in FIG. 9.

Example 9

Figure 10:
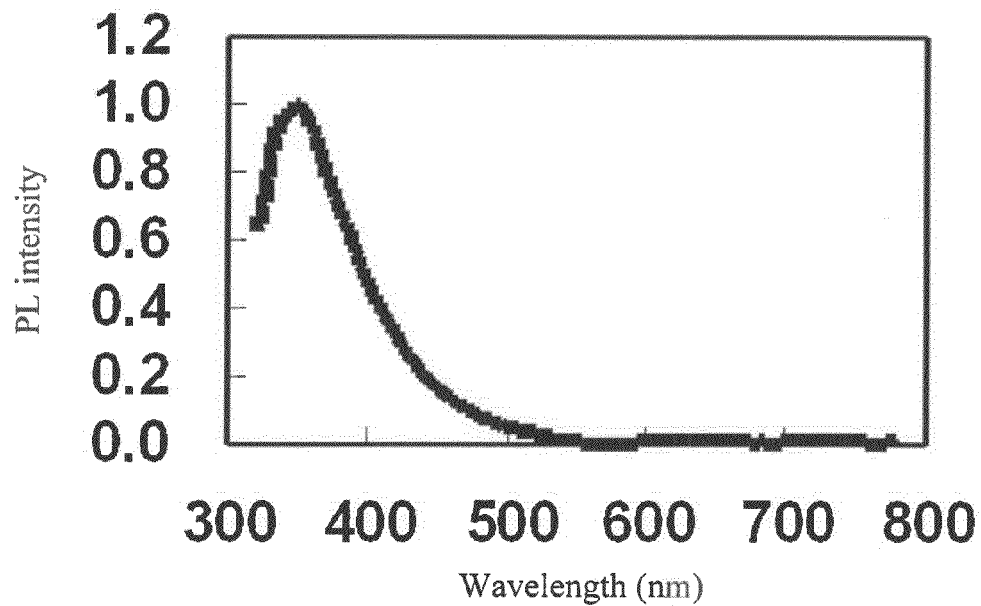
FIG. 10 An ultraviolet excitation-emission spectrum of a phosphor obtained in Example 9.

The procedure of Example 5 was repeated, except that no PEG was used. The ultraviolet excitation-emission spectrum of the resulting phosphor is shown in FIG. 10.

Example 10

Figure 11:
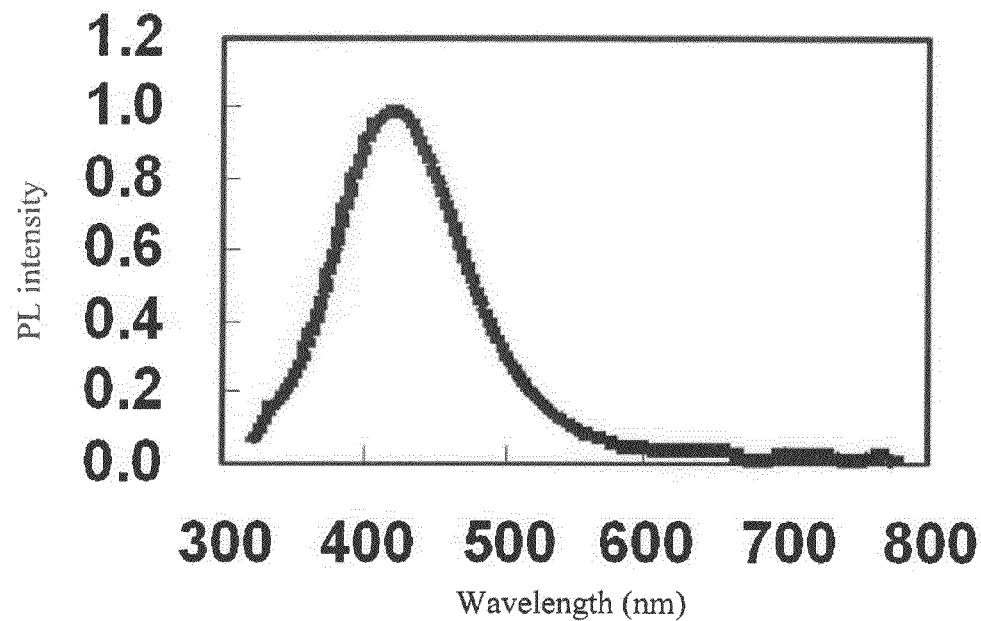
FIG. 11 An ultraviolet excitation-emission spectrum of a phosphor obtained in Example 10.

The procedure of Example 5 was repeated, except that boric anhydride was used in place of boric acid. The ultraviolet excitation-emission spectrum of the resulting phosphor is shown in FIG. 11.

Example 11

Figure 12:
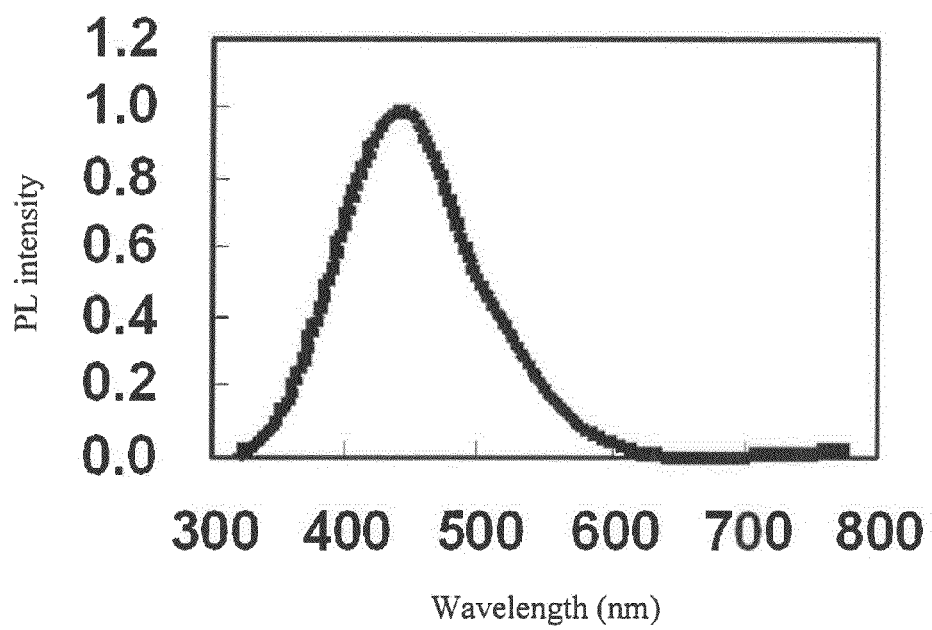
FIG. 12 An ultraviolet excitation-emission spectrum of a phosphor obtained in Example 11.

The procedure of Example 5 was repeated, except that ammonium borate was used in place of boric acid. The ultraviolet excitation-emission spectrum of the resulting phosphor is shown in FIG. 12.

Example 12

Figure 13:
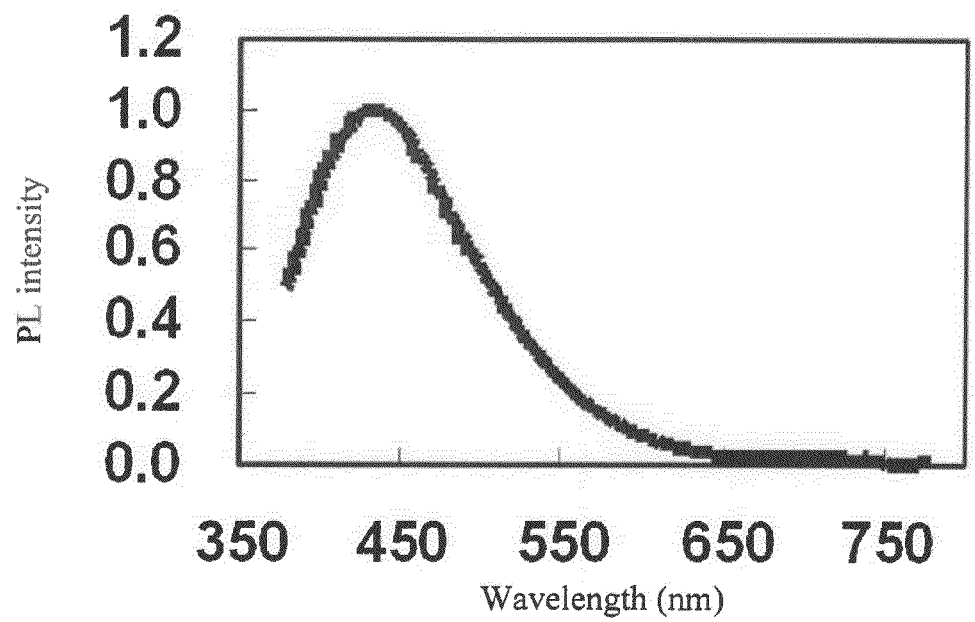
FIG. 13 An ultraviolet excitation-emission spectrum of a phosphor obtained in Example 12.

The procedure of Example 5 was repeated, except that ethyl carbamate was used in place of carbamide. The ultraviolet excitation-emission spectrum of the resulting phosphor is shown in FIG. 13.

Example 13

Figure 14:
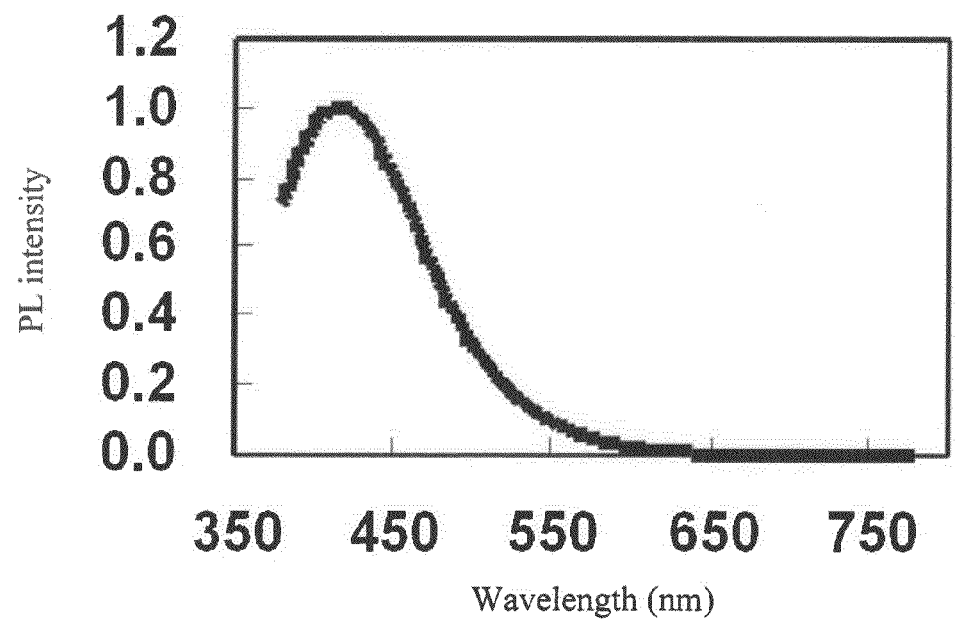
FIG. 14 An ultraviolet excitation-emission spectrum of a phosphor obtained in Example 13.

The procedure of Example 5 was repeated, except that acetamide was used in place of carbamide. The ultraviolet excitation-emission spectrum of the resulting phosphor is shown in FIG. 14.

Example 14

Figure 15:
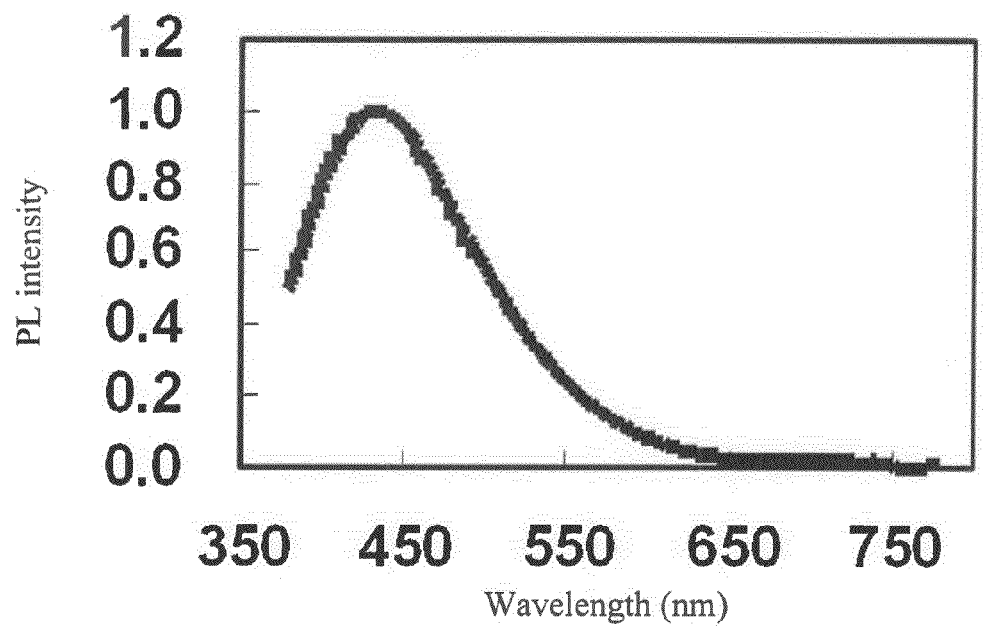
FIG. 15 An ultraviolet excitation-emission spectrum of a phosphor obtained in Example 14.

The procedure of Example 5 was repeated, except that ammonium formate was used in place of carbamide. The ultraviolet excitation-emission spectrum of the resulting phosphor is shown in FIG. 15.

Example 15

Figure 16:
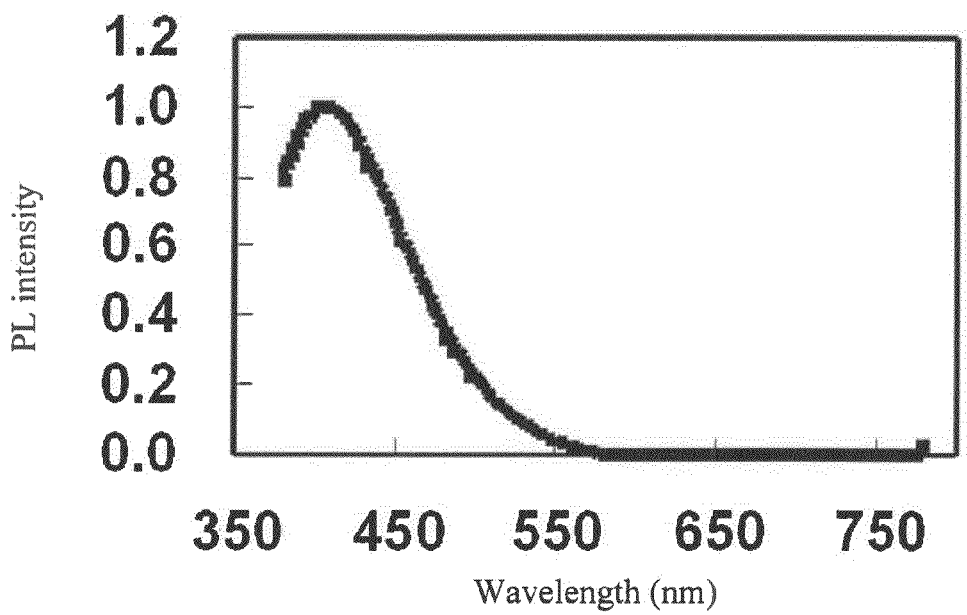
FIG. 16 An ultraviolet excitation-emission spectrum of a phosphor obtained in Example 15.

The procedure of Example 9 was repeated, except that the procedure was carried out in a nitrogen atmosphere. The ultraviolet excitation-emission spectrum of the resulting phosphor is shown in FIG. 16.

Example 16

Figure 17:
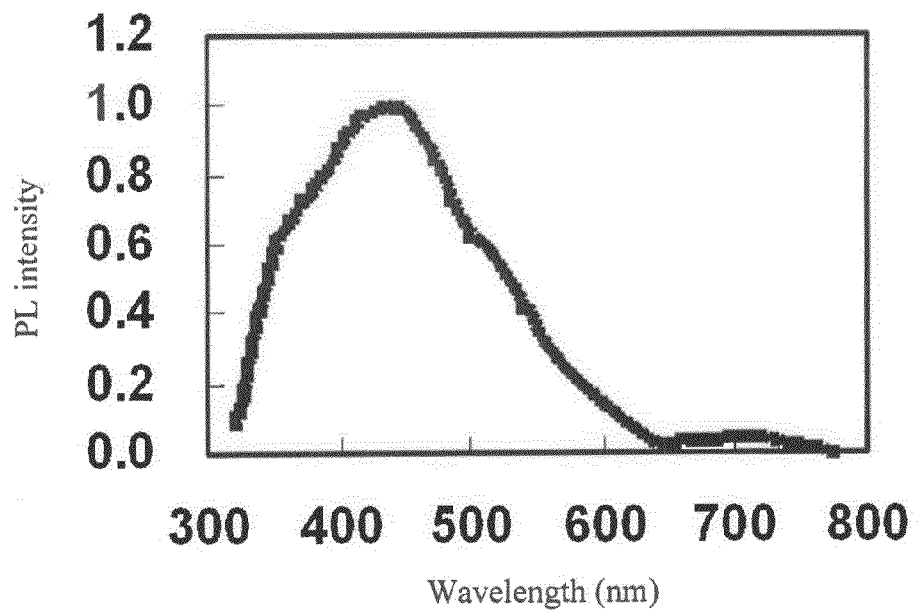
FIG. 17 An ultraviolet excitation-emission spectrum of a phosphor obtained in Example 16.

In a mortar, 0.3 g of aluminum hydroxide, 3.0 g of carbamide, and 0.2 g of PEG (molecular weight: 20000) were sufficiently ground and mixed. The mixture was placed in an alumina boat. Then, the alumina boat was placed in a cylindrical tubular furnace, heated to 800° C. in the atmosphere at a rate of 20° C. per minute, maintained at 800° C. for 10 minutes, and then allowed to cool down in nitrogen. The ultraviolet excitation-emission spectrum of the resulting phosphor is shown in FIG. 17.

Example 17

Figure 18:
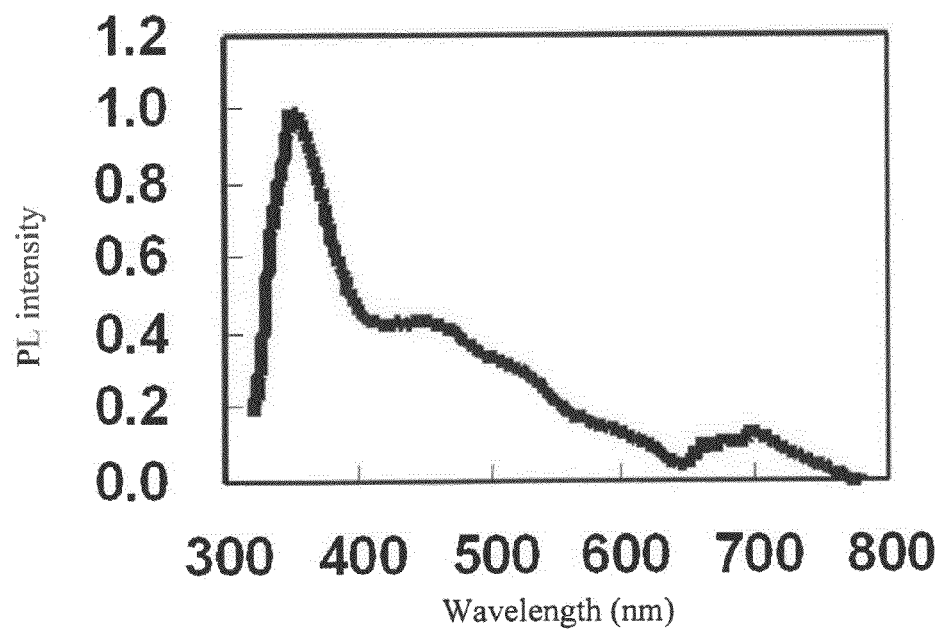
FIG. 18 An ultraviolet excitation-emission spectrum of a phosphor obtained in Example 17.

In a 50-ml beaker, 0.6 g of gallium sulfate was dissolved in 15 g of ion exchange water. A pH was adjusted to pH=10 with an aqueous solution of 25% ammonia, and then the mixture was stirred for 30 minutes. The resulting white precipitate was washed by decantation to remove water of an upper layer. Then, 3.0 g of carbamide and 0.2 g of PEG 20000 were added, and the mixture was transferred into an alumina boat. The alumina boat was placed in a cylindrical tubular furnace, heated to 800° C. in the atmosphere at a rate of 20° C. per minute, maintained at 800° C. for 10 minutes, and then allowed to cool down in nitrogen. The ultraviolet excitation-emission spectrum of the resulting phosphor is shown in FIG. 18.

Example 18

Figure 19:
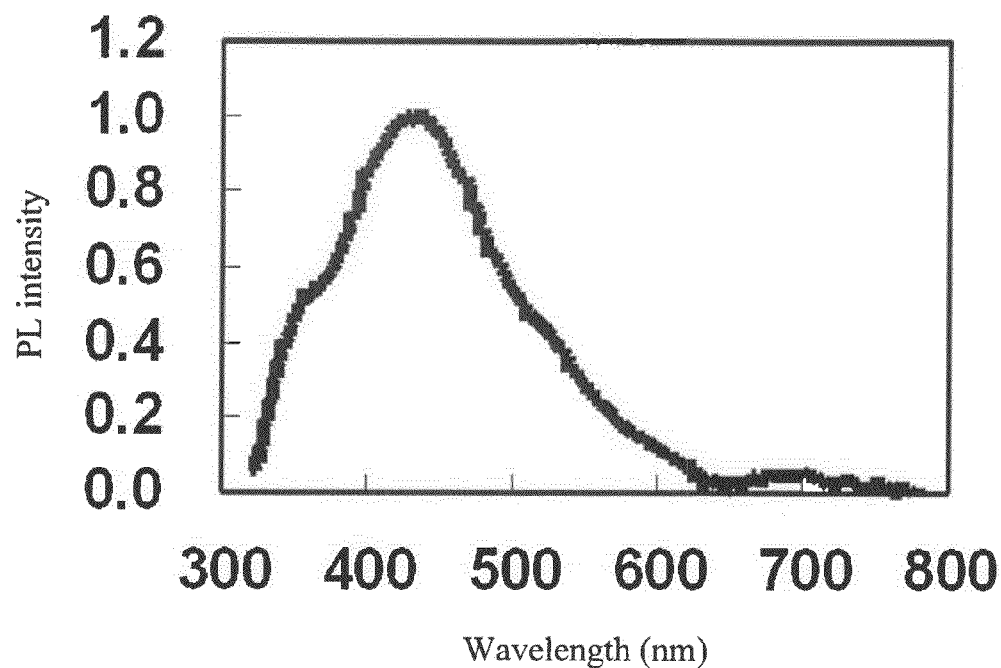
FIG. 19 An ultraviolet excitation-emission spectrum of a phosphor obtained in Example 18.

In a mortar, 0.3 g of indium hydroxide, 3.0 g of carbamide, and 0.2 g of PEG (molecular weight: 20000) were sufficiently ground and mixed. The mixture was placed in an alumina boat. Then, the alumina boat was placed in a cylindrical tubular furnace, heated to 800° C. in the atmosphere at a rate of 20° C. per minute, maintained at 800° C. for 10 minutes, and then allowed to cool down in nitrogen. The ultraviolet excitation-emission spectrum of the resulting phosphor is shown in FIG. 19.

Comparative Example 1

One gram of the phosphor that was obtained in Example 1 was placed in a quartz boat, and an inner system of a cylindrical reaction tube that was heated to a predetermined temperature was purged with nitrogen. Thereafter, ammonia gas and argon gas were fed to carry out nitriding treatment. The gases were fed at 500 sccm. After 600-minute nitriding treatment, the sample was allowed to cool to room temperature in nitrogen gas and then recovered in a nitrogen atmosphere. Measurement of an amount of oxygen was carried out, but no oxygen was detected. No emission of fluorescent light by ultraviolet excitation was observed.

Comparative Example 2

The procedure of Example 11 was repeated, except that no carbamide was added. No carbon was detected in the resulting firing product. No emission of fluorescent light by ultraviolet excitation was observed.

Comparative Example 3

The procedure of Example 1 was repeated, except that diphenyl carbonate was used. No nitrogen was detected in the resulting firing product. No emission of light by ultraviolet excitation was observed.

Comparative Example 4

The procedure of Example 1 was repeated, except that no boric acid was used. No boron was detected in the resulting firing product. No carbon emission by ultraviolet excitation was observed.

The following Examples illustrate the dispersion-type EL device having in the phosphor layer the M-C—N—O based phosphor of the present invention.

Example 19

In a 200-ml beaker, 66.6 g of ultrapure water, 3.06 g of boric acid, 30.6 g of carbamide, and 1.0 g of polyethylene glycol (molecular weight: 20000) were stirred at 40° C. for 1 hour to result in complete dissolution. The resulting solution was transferred into a crucible. Then, the crucible was placed in a heating-firing furnace that had been preheated to 100° C., and heated to 800° C. at a rate of 20° C./minute. After the temperature reached 800° C., the crucible was maintained for 30 minutes, subsequently allowed to cool down to 100° C. Then, the crucible was transferred into a desiccator and allowed to cool down to room temperature.

To 1.5 g of the resulting phosphor, 1.0 g of a fluorine based binder (DuPont 7155) was added as the binder, and the mixture was defoamed to produce a light emitting layer paste. A layer with a thickness of 40 μm was formed on an ITO-bearing PET film by use of a 20-mm square screen mask (200 mesh, 25 μm). Then, a layer of a barium titanate paste (DuPont 7153) was formed using a screen mask (150 mesh, 25 μm). After drying at 100° C. for 10 minutes, layers were formed again and dried at 100° C. for 10 minutes to produce a 20-μm dielectric layer.

Figure 20:
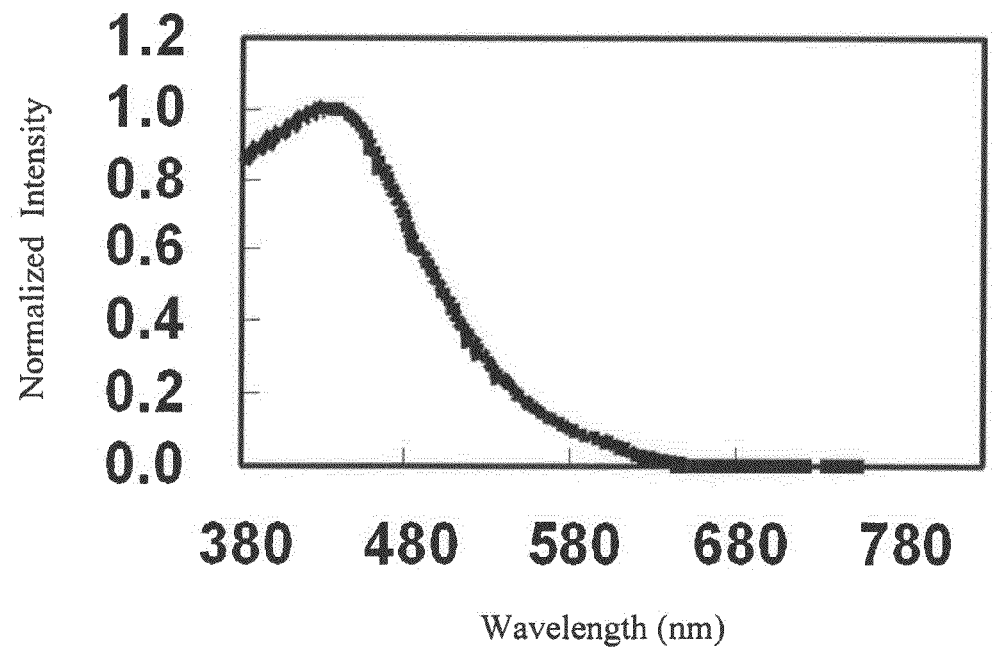
FIG. 20 An emission spectrum of an inorganic EL device obtained in Example 19.

A layer of a silver paste (Acheson 461 SS) was formed as an electrode on the dielectric layer by use of a screen mask (150 mesh, 25 μm) and dried at 100° C. for 10 minutes to produce an electrode, whereby a dispersion-type EL device was produced. The resulting device was subjected to EL material evaluation at 200 V and 1 kHz. The obtained EL emission spectrum is shown in FIG. 20, and the results are shown in Table 3.

Example 20

Figure 21:
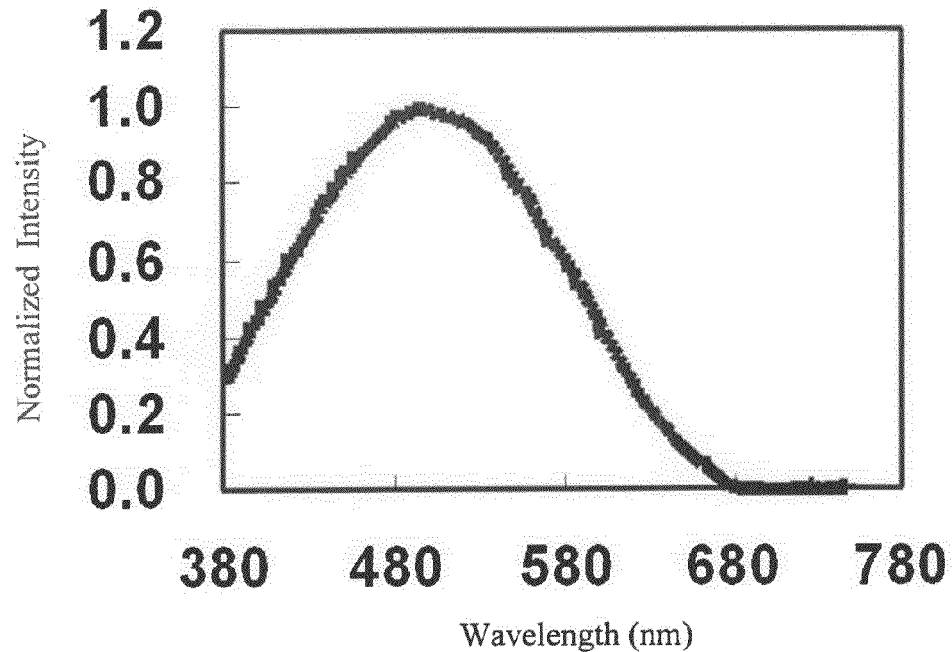
FIG. 21 An emission spectrum of an inorganic EL device obtained in Example 20.

The procedure of Example 19 was repeated, except that 19.2 g of carbamide was used in place of 30.6 g of carbamide, 2.0 g of polyethylene glycol was used in place of 1.0 g of polyethylene glycol, and the firing temperature was 700° C. The obtained EL emission spectrum is shown in FIG. 21, and the results are shown in Table 3.

TABLE 3

| | Peak top (nm) | Brightness (Cd/m$^2$) |
|---|---|---|
| Example 19 | 424 | 11 |
| Example 20 | 502 | 13 |

The following Examples illustrate the light emitting device comprising in the phosphor layer the M-C—N—O based phosphor of the present invention. The light emitting device included a GaN based ultraviolet LED in a light emitting section.

Example 21

In a 200-ml beaker, 66.6 g of ultrapure water, 3.06 g of boric acid, 30.6 g of carbamide, and 1.0 g of polyethylene glycol (molecular weight: 20000) were stirred at 40° C. for 1 hour to result in complete dissolution. The resulting solution was transferred into a crucible. Then, the crucible was placed in a heating-firing furnace that had been preheated to 100° C., and heated to 800° C. at a rate of 20° C./minute. After the temperature reached 800° C., the crucible was maintained for 30 minutes, allowed to cool down to 100° C. Then the crucible was transferred into a desiccator and allowed to cool down to room temperature.

Figure 22:
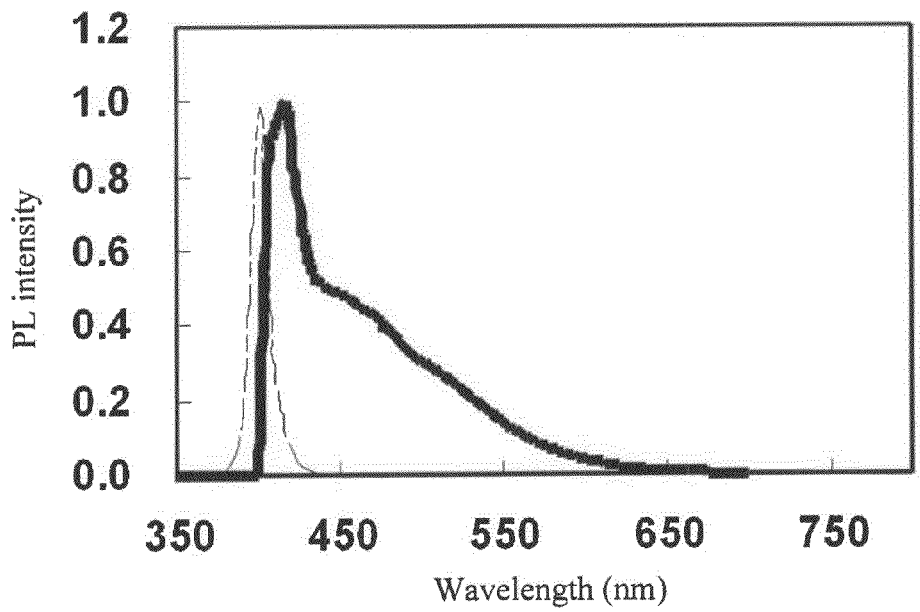
FIG. 22 An emission spectrum of an LED obtained in Example 21.

Ten grams of a solution containing 46% polyvinyl alcohol and 54% water was added to 100 mg of the resulting phosphor, and the resulting mixture was further ground in the mortar, whereby the phosphor particles were dispersed into the mixture. The dispersion product was applied onto a surface of the GaN based ultraviolet LED and dried at 60° C. A voltage of 4.2 V was applied to the ultraviolet LED having the dispersion product with a thickness of 20 μm on an outer surface of a transparent resin section. The emission spectrum of light emitted from the LED is shown in FIG. 22. It shows that ultraviolet light was converted into blue light. The dashed line indicates an emission spectrum curve of a GaN based ultraviolet LED of the present invention having no phosphor layer, which is described below (Comparative Example 5). The foregoing explanation of the dashed line is also the case with FIGS. 23-25.

Example 22

Figure 23:
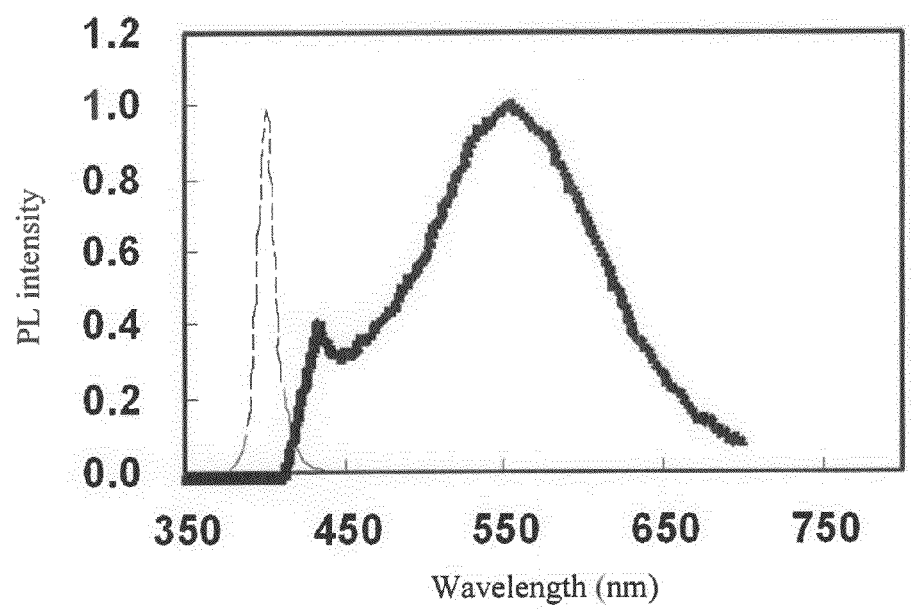
FIG. 23 An emission spectrum of an LED obtained in Example 22.

The procedure of Example 21 was repeated, except that 19.2 g of carbamide was used in place of 30.6 g of carbamide, 2.0 g of polyethylene glycol was used in place of 1.0 g of polyethylene glycol, and the firing temperature was 700° C. The obtained LED emission spectrum is shown in FIG. 23.

Example 23

Figure 24:
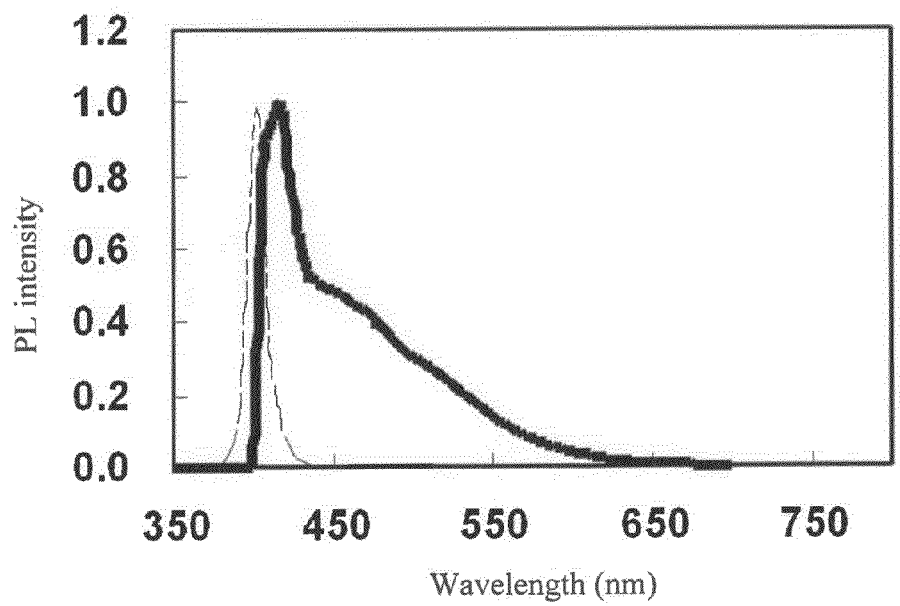
FIG. 24 An emission spectrum of an LED obtained in Example 23.

The procedure of Example 21 was repeated, except that the dispersion product was applied with a thickness of 10 μm onto an inner surface of the transparent resin section. The results were almost the same as those in Example 21. The obtained LED emission spectrum is shown in FIG. 24.

Example 24

Figure 25:
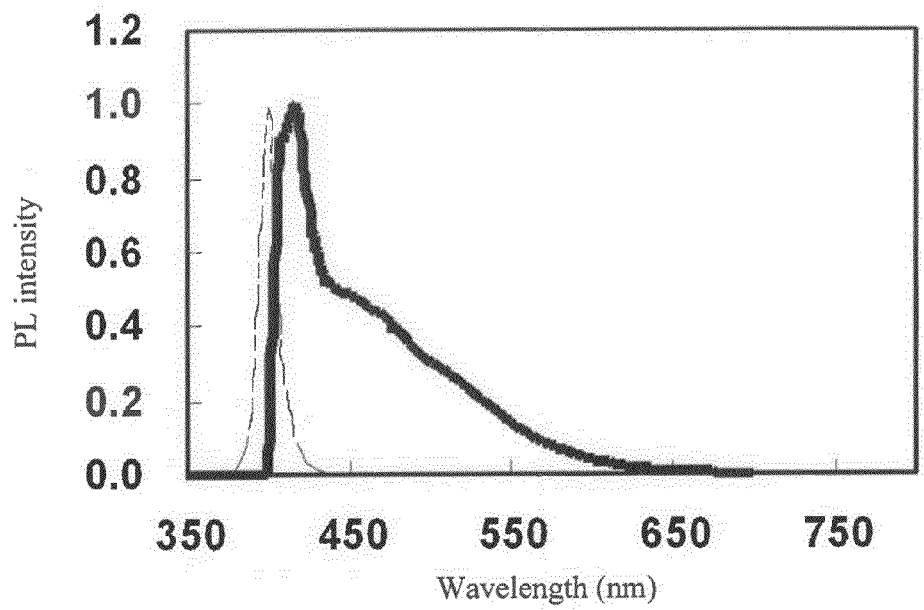
FIG. 25 An emission spectrum of an LED obtained in Example 24.

The procedure of Example 21 was repeated, except that the dispersion product was applied with a thickness of 20 μm onto a surface of the light emitting device. The obtained LED emission spectrum is shown in FIG. 25. It shows that ultraviolet light was converted into blue light.

Comparative Example 5

Figure 26:
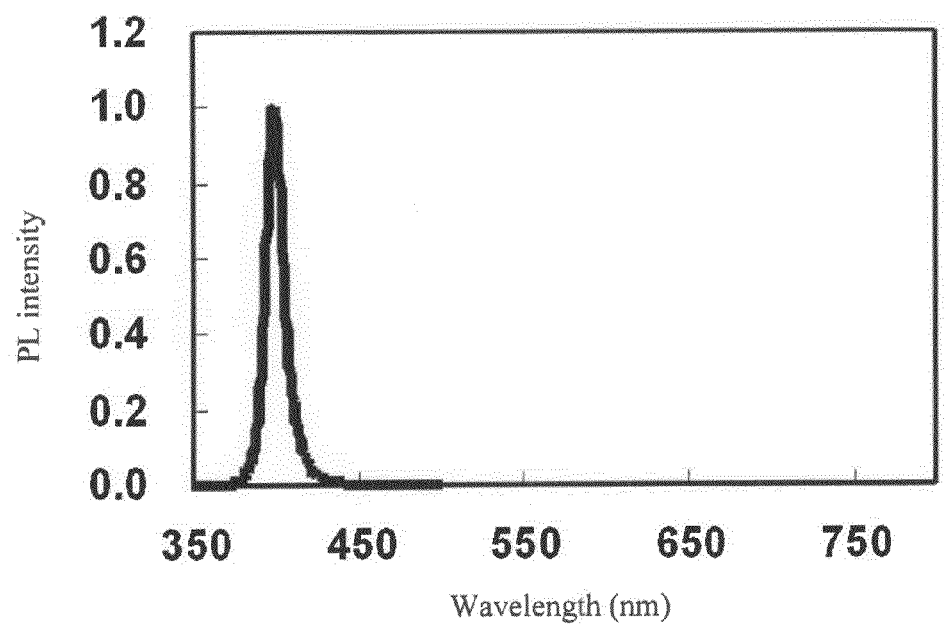
FIG. 26 An emission spectrum of an LED without a phosphor.

The emission spectrum of an LED to which no phosphor was applied is shown in FIG. 26.

The following Examples illustrate the fluorescent tube comprising in the phosphor layer the M-C—N—O based phosphor of the present invention. A commercially available 15-W fluorescent lamp was used.

Example 25

In a 200-ml beaker, 66.6 g of ultrapure water, 3.06 g of boric acid, 30.6 g of carbamide, and 1.0 g of polyethylene glycol (molecular weight: 20000) were put and stirred at 40° C. for 1 hour to result in complete dissolution. The resulting solution was transferred into a crucible. Then, the crucible was placed in a heating-firing furnace that had been preheated to 100° C., and heated to 800° C. at a rate of 20° C./minute. After the temperature reached 800° C., the crucible was maintained for 30 minutes, allowed to cool down to 100° C. Then the crucible was transferred into a desiccator and allowed to cool down to room temperature.

Figure 27:
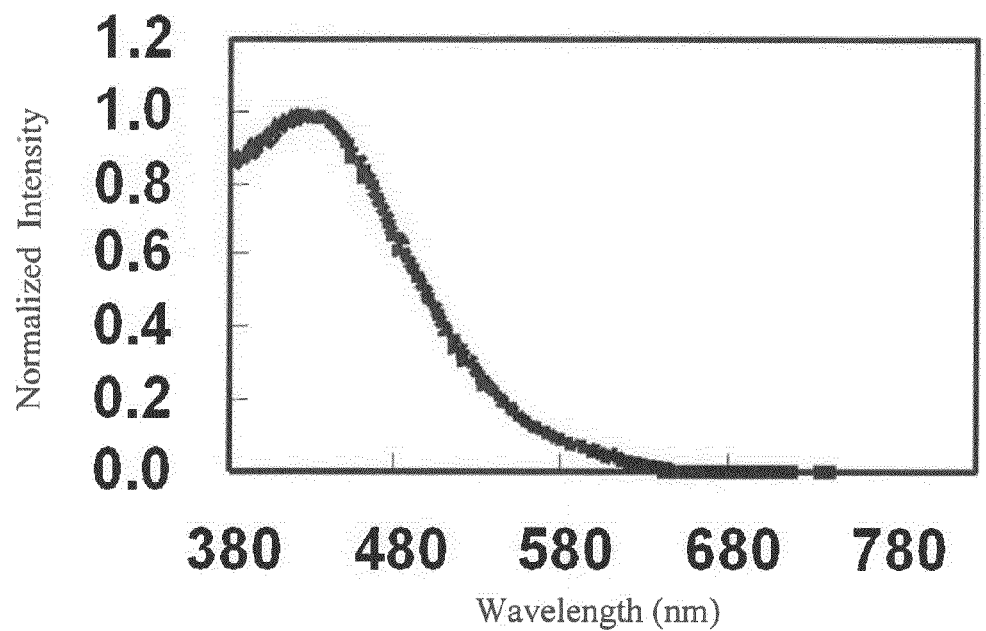
FIG. 27 An emission spectrum of a film obtained in Example 25.

Ten grams of a solution containing 46% polyvinyl alcohol and 54% water was added to 100 mg of the resulting phosphor, and the resulting mixture was further ground in the mortar, whereby the phosphor particles were dispersed into the mixture. The resulting mixture was applied with a thickness of 20 microns onto an ethylene tetrafluoride resin sheet by a bar-coater and then dried at 40° C. to obtain a phosphor-dispersed film (light emitting film) having a thickness of 16 microns. The emission spectrum of the resulting film is shown in FIG. 27. The resulting film was attached to the 15-W fluorescent lamp, and an illuminance at a point 40 cm below the film was measured by Illuminometer T-10wp manufactured by Konica Minolta Holdings, Inc; the illuminance was 577 lx. Since an illuminance of a fluorescent lamp without the light emitting film was 550 lx, it is recognized that the attachment of light emitting film improved the illuminance of the fluorescent lamp by 27 lx.

Example 26

Ten grams of a solution containing 46% polyvinyl alcohol and 54% water were added to 100 mg of the phosphor that was obtained in Example 25, and the resulting mixture was further ground in the mortar, whereby the phosphor particles were disperse into the mixture. The resulting mixture was applied with a thickness of 16 microns onto a surface of the 15-W fluorescent lamp. After the applied solution was dried, an illuminance at a point 40 cm below the film was measured by Illuminometer T-10wp manufactured by Konica Minolta Holdings, Inc; the illuminance was 582 lx. In Example 26, an illuminance of the common fluorescent lamp was improved by 32 lx.

Example 27

In a mortar, 50 mg of the phosphor that was obtained in Example 19 and 50 mg of the phosphor that was obtained in Example 2 were ground and mixed, and 10 g of a solution containing 46% polyvinyl alcohol and 54% water was added to the mixture. The resulting mixture was further ground in the mortar, whereby the phosphor particles were dispersed into the mixture. The dispersion product was applied onto a surface of the GaN based ultraviolet LED and dried at 60° C. A voltage of 4.2 V was applied to the ultraviolet LED having the dispersion product with a thickness of 20 μm on an outer surface of a transparent resin section. The obtained LED emission spectrum is shown in FIG. 28.

Figure 28:
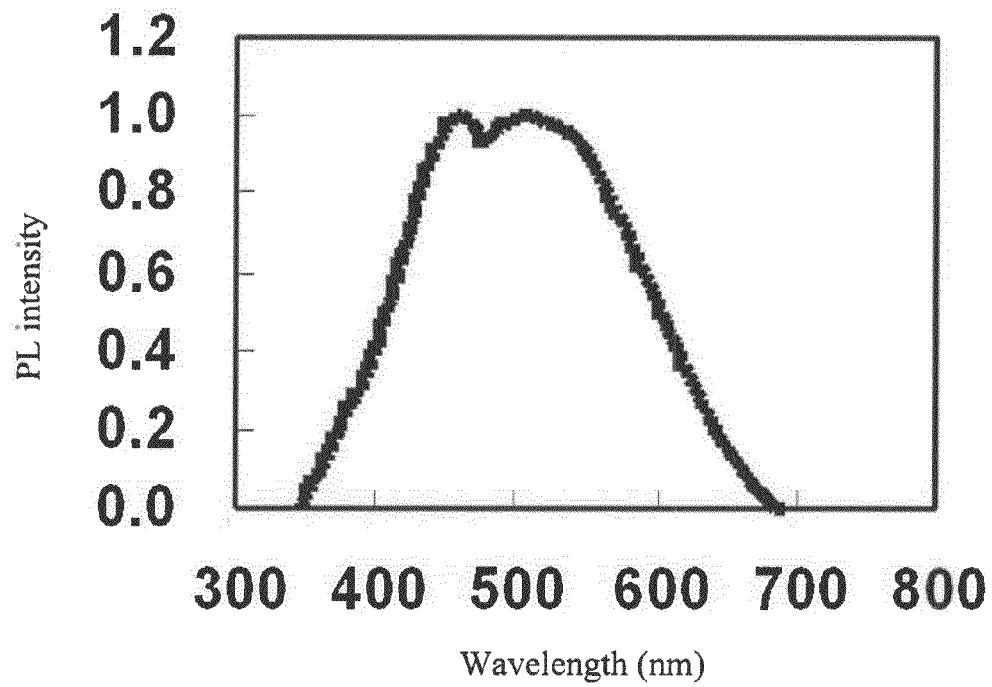
FIG. 28 An emission spectrum of an LED obtained in Example 27.

As shown in FIG. 28, the emission spectrum curve has two peaks, indicating that ultraviolet rays were respectively converted by the two phosphors. According to the present invention, the phosphor layer can be produced that exhibits not only the foregoing emission spectrum curve having two peaks but also an emission spectrum curve having a plurality of desired peaks. In other words, the present invention can provide the phosphor layer comprising the M-C—N—O based phosphor having a plurality of different emission peaks.

INDUSTRIAL APPLICABILITY

The M-C—N—O based phosphor of the present invention can be easily produced from inexpensive materials at a relatively low temperature without using heavy metals and rare metals. The M-C—N—O based phosphor of the present invention can provide luminescent materials of various wavelengths depending on the amount of carbon contained; thus, the M-C—N—O based phosphor of the present invention can be used as phosphors for CRT, PDP, and the like.

The polymer dispersion or light emitting film comprising the M-C—N—O based phosphor of the present invention can be used to produce various fluorescent/luminescent materials having high environmental compatibility and emitting light of various, previously unavailable colors, such as inorganic EL devices, light emitting devices using excitation light from LEDs or laser diodes, and fluorescent tubes.

The invention claimed is:

1. An M-C—N—O based phosphor, comprising a group 13 element (M), carbon (C), nitrogen (N), and oxygen (O), wherein
an amount of the group 13 element (M) contained is $1\%<(M)<50\%$ by mass,
an amount of carbon (C) contained is $0.005\%<(C)<10\%$ by mass,
an amount of nitrogen (N) contained is $1\%<(N)<60\%$ by mass,
an amount of oxygen (O) contained is $1\%<(O)<75\%$ by mass, and
$(M)+(C)+(N)+(O)=100\%$ by mass.

2. The M-C—N—O based phosphor of claim 1, wherein a color changes according to an amount of carbon (C) contained.

3. The M-C—N—O based phosphor of claim 1, wherein an amount of carbon (C) contained is 0.01-9.0% by mass.

4. The M-C—N—O based phosphor of claim 1, wherein a peak top of an emission spectrum of the phosphor varies in a wavelength range of 300-800 nm.

5. The M-C—N—O based phosphor of claim 1, wherein a peak top of an emission spectrum of the phosphor varies in a wavelength range of 400-650 nm.

6. The M-C—N—O based phosphor of claim 1, wherein the group 13 element (M) is boron (B).

* * * * *

UNITED STATES PATENT AND TRADEMARK OFFICE
CERTIFICATE OF CORRECTION

PATENT NO. : 8,668,843 B2
APPLICATION NO. : 12/593307
DATED : March 11, 2014
INVENTOR(S) : Okuyama et al.

It is certified that error appears in the above-identified patent and that said Letters Patent is hereby corrected as shown below:

On the title page, Item [73] should read:

-- [73] Assignees: Hiroshima University, Higashi-Hiroshima-shi (JP);
Kuraray Co., Ltd., Kurashiki-shi (JP); --

Signed and Sealed this
Second Day of December, 2014

Michelle K. Lee
*Deputy Director of the United States Patent and Trademark Office*